(12) United States Patent
Park et al.

(10) Patent No.: US 10,559,334 B2
(45) Date of Patent: Feb. 11, 2020

(54) DATA OUTPUT CIRCUIT, MEMORY DEVICE INCLUDING THE DATA OUTPUT CIRCUIT, AND OPERATING METHOD OF THE MEMORY DEVICE

(71) Applicant: SAMSUNG ELECTRONICS CO., LTD., Suwon-si, Gyeonggi-Do (KR)

(72) Inventors: Hyunsoo Park, Seoul (KR); Yongjun Kim, Hwaseong-si (KR); Chang-Yong Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/031,408

(22) Filed: Jul. 10, 2018

(65) Prior Publication Data

US 2019/0156870 A1    May 23, 2019

(30) Foreign Application Priority Data

Nov. 21, 2017   (KR) .................. 10-2017-0155877

(51) Int. Cl.
*G11C 7/22* (2006.01)
*G11C 7/10* (2006.01)
*H03M 9/00* (2006.01)
*G11C 8/10* (2006.01)
*G11C 8/06* (2006.01)

(52) U.S. Cl.
CPC ............ *G11C 7/222* (2013.01); *G11C 7/1051* (2013.01); *G11C 7/1078* (2013.01); *H03M 9/00* (2013.01); *G11C 7/225* (2013.01); *G11C 8/06* (2013.01); *G11C 8/10* (2013.01)

(58) Field of Classification Search
CPC .............................. G11C 7/1051; G11C 7/222
USPC ......................................... 365/189.05, 233.1
See application file for complete search history.

(56) References Cited

U.S. PATENT DOCUMENTS

| 5,726,990 | A | 3/1998 | Shimada et al. |
| 7,551,107 | B2 | 6/2009 | Shim et al. |
| 8,169,348 | B2 | 5/2012 | Tsunoda |
| 8,305,819 | B2* | 11/2012 | Kim ..................... G11C 7/10 365/189.05 |

(Continued)

FOREIGN PATENT DOCUMENTS

| JP | 11-017636 | 1/1999 |
| KR | 10-0578036 | 5/2006 |

*Primary Examiner* — Son L Mai
(74) *Attorney, Agent, or Firm* — F. Chau & Associates, LLC

(57) ABSTRACT

A memory device includes a memory cell array storing input data, a clock generator circuit generating first clocks and second clocks using a reference clock, a phase information generator circuit comparing a phase of the reference clock and a phase of at least one of the first clocks and the second clocks and generating phase information as a comparison result, an intermediate data generator circuit serializing a part of input data provided from the memory cell array based on the first clocks to generate first data, serializing a remaining part of the input data to generate second data, and selectively swapping the first data and the second data using the phase information to generate intermediate data, and an output data generator circuit serializing the intermediate data using the second clocks, to output output data through one output data line.

20 Claims, 16 Drawing Sheets

(56) References Cited

U.S. PATENT DOCUMENTS

2004/0213580 A1 10/2004 Masuda et al.
2010/0149137 A1 6/2010 Saito

* cited by examiner

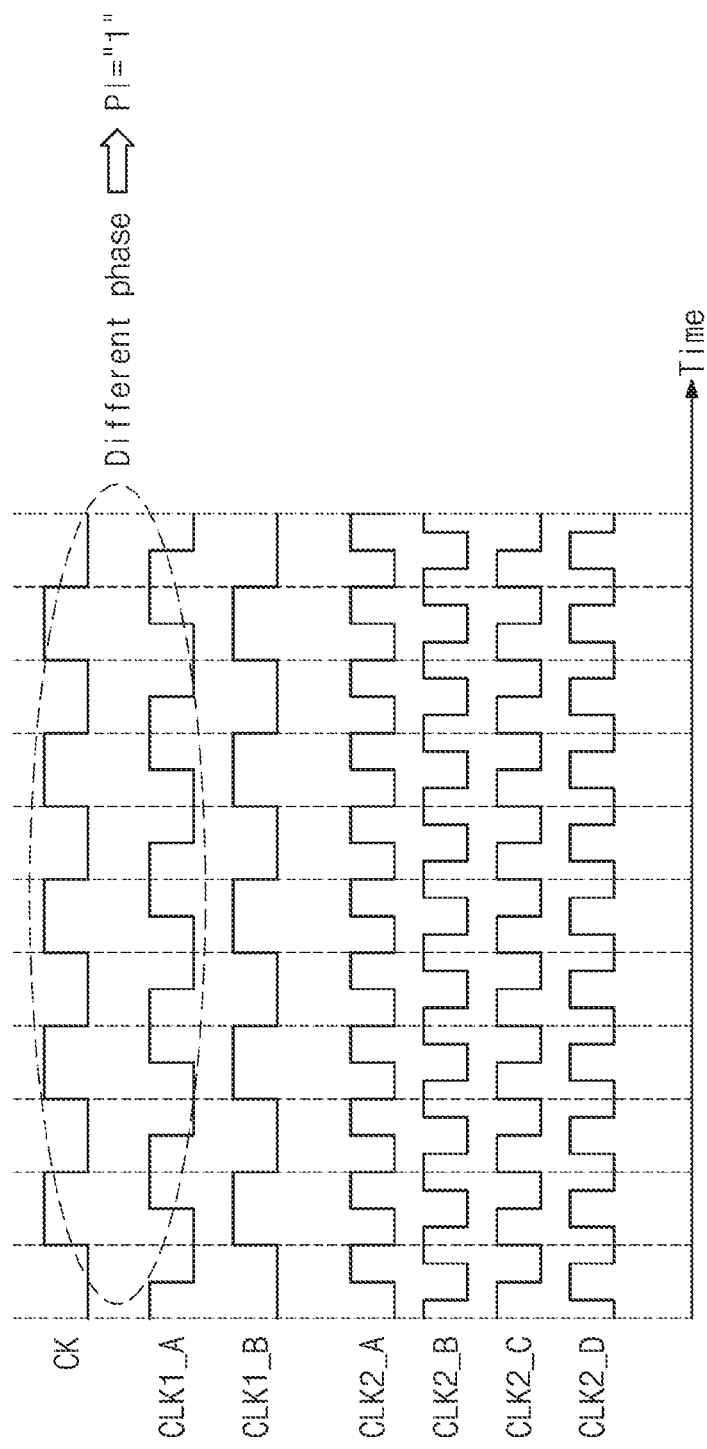

DATA OUTPUT CIRCUIT, MEMORY DEVICE INCLUDING THE DATA OUTPUT CIRCUIT, AND OPERATING METHOD OF THE MEMORY DEVICE

CROSS-REFERENCE TO RELATED APPLICATION

This application claims priority under 35 U.S.C. § 119 to Korean Patent Application No. 10-2017-0155877, filed on Nov. 21, 2017 in the Korean Intellectual Property Office, the disclosure of which is incorporated by reference herein in its entirety.

TECHNICAL FIELD

Exemplary embodiments of the inventive concept described herein relate to a semiconductor memory, and more particularly, relate to a data output circuit, a memory device including the data output circuit, and an operating method of the memory device.

DISCUSSION OF RELATED ART

Semiconductor memory devices may be classified into volatile memory devices and nonvolatile memory devices. A volatile memory device refers to a memory device that loses data stored therein when powered-off. As a type of volatile memory device, a dynamic random access memory (DRAM) may be used in various devices such as a mobile system, a server, a graphic device, or the like.

A graphics double data rate (GDDR) synchronous dynamic random access memory (SDRAM) is a kind of graphic card memory. The GDDR SDRAM may transmit and receive data at a fast speed for performing a graphic operation quickly. For this reason, the GDDR SDRAM may require a wider bandwidth than a double data rate (DDR) SDRAM used in a personal computer (PC) or the like.

To increase the performance of the GDDR SDRAM, the GDDR SDRAM may drive a data output circuit using a high clock frequency. The data output circuit may output more data during a unit time as clock frequency increases. However, when the clock frequency continues to increase, an effective margin for data output may decrease, and power consumption may increase.

SUMMARY

According to an exemplary embodiment of the inventive concept, a memory device includes a memory cell array that stores input data, a clock generator circuit that generates first clocks and second clocks, using a reference clock, a phase information generator circuit that compares a phase of the reference clock and a phase of at least one of the first clocks and the second clocks and generates phase information as the comparison result, an intermediate data generator circuit that serializes a part of the input data provided from the memory cell array using the first clocks to generate a plurality of first data, serializes a remaining part of the input data to generate a plurality of second data, and selectively swaps the plurality of first data and the plurality of second data using the phase information to generate a plurality of intermediate data, and an output data generator circuit that serializes the plurality of intermediate data using the second clocks, to output output data through one output data line.

According to an exemplary embodiment of the inventive concept, an operating method of a memory device comprising a memory cell array storing input data includes generating first clocks and second clocks, using a reference clock, generating phase information associated with the first clocks and the second clocks, serializing a part of the input data provided from the memory cell array to generate a plurality of first data and serializing a remaining part of the input data to generate a plurality of second data, using the first clocks, selectively swapping the plurality of first data and the plurality of second data using the phase information to generate a plurality of intermediate data, and serializing the plurality of intermediate data using the second clocks to output output data through one output data line.

According to an exemplary embodiment of the inventive concept, a data output circuit includes a first serialization circuit that operates based on first clocks, where the first serialization circuit serializes a part of input data to generate a plurality of first data and serialized a remaining part of the input data to generate a plurality of second data, a data swap circuit that selectively swaps the plurality of first data and the plurality of second data using the phase information of the first clocks, to generate a plurality of third data, a second serialization circuit that serializes the plurality of third data using the first clocks, to generate a plurality of intermediate data, and an output data generator circuit that serializes the plurality of intermediate data using second clocks, to output output data through one output data line.

BRIEF DESCRIPTION OF THE FIGURES

The above and other objects and features of the inventive concept will become apparent by describing in detail exemplary embodiments thereof with reference to the accompanying drawings.

FIGS. 4A and 4B illustrate views of clocks generated from a clock generator of FIG. 3 according to an exemplary embodiment of the inventive concept.

DETAILED DESCRIPTION OF THE EMBODIMENTS

Figure 1:
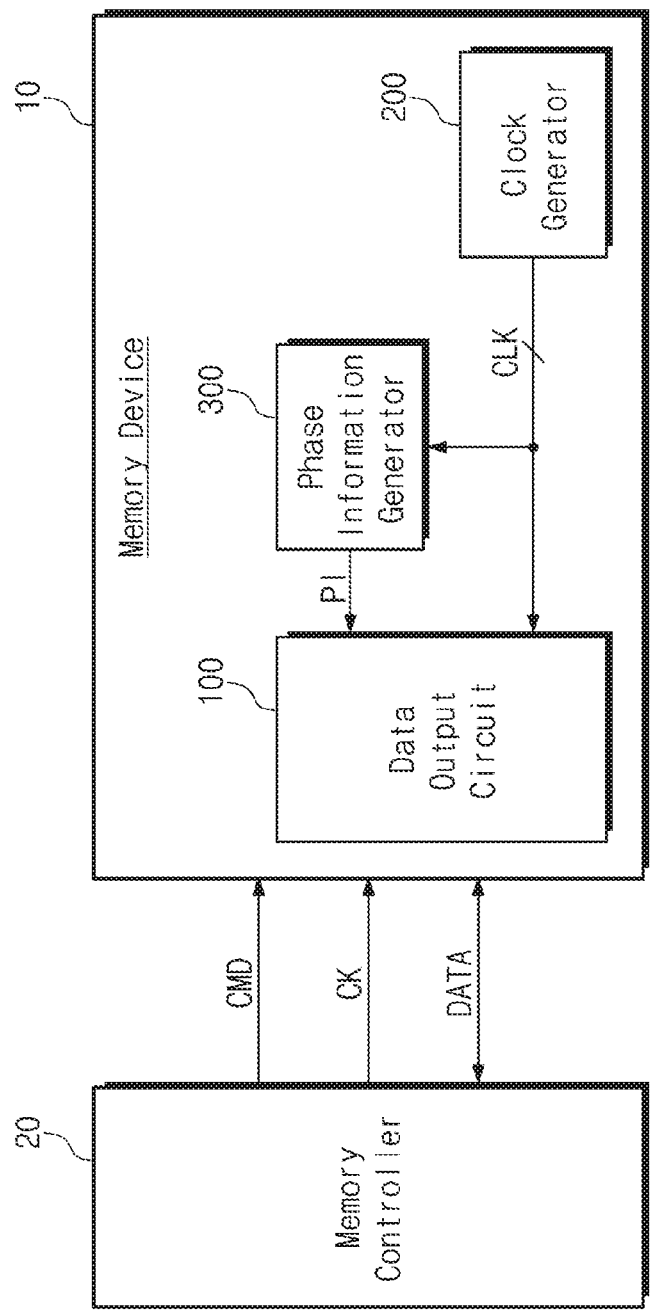
FIG. 1 illustrates a block diagram of a memory device and a memory controller according to an exemplary embodiment of the inventive concept.

Exemplary embodiments of the inventive concepts provide a data output circuit with reduced power consumption, a memory device including the data output circuit, and an operating method of the memory device.

Exemplary embodiments of the inventive concept will now be described in detail with reference to the accompanying drawings.

Terms, such as "block", "unit", "module", "driver", "circuit", or the like, which performs a specific function or includes a specific function, to be described below or illustrated in the drawings, may be implemented in the form of software, hardware, or a combination thereof.

FIG. 1 illustrates a block diagram of a memory device and a memory controller according to an exemplary embodiment of the inventive concept. Referring to FIG. 1, a memory controller 20 may control an operation of a memory device 10. In an exemplary embodiment of the inventive concept, the memory device 10 may include at least one of volatile or nonvolatile memories such as static random access memory (SRAM), dynamic RAM (DRAM), synchronous DRAM (SDRAM), read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), or the like.

Hereinafter, for convenience of description, it is assumed that the memory device 10 is a DRAM.

The memory device 10 may receive a data read command CMD and a reference clock CK from the memory controller 20. The memory device 10 may output data "DATA" stored in the memory device 10 in response to the data read command CMD. The memory device 10 may control operations of components, based on the reference clock CK.

The memory device 10 may include a data output circuit 100, a clock generator 200, and a phase information generator 300. The clock generator 200 and the phase information generator 300 may also be circuits.

The data output circuit 100 may output the data "DATA" stored in the memory device 10 in response to the data read command CMD. The data output circuit 100 may serialize data stored in a plurality of memory cells and may output the serialized data. In other words, the data output circuit 100 may serialize parallel data and may output the serialized data.

The clock generator 200 may generate a plurality of clocks CLK, based on the reference clock CK. The clock generator 200 may generate the plurality of clocks CLK having various frequencies and phases, based on the reference clock CK. The plurality of clocks CLK thus generated may be provided to the data output circuit 100 and the phase information generator 300.

The phase information generator 300 may generate phase information PI about the clocks CLK generated by the clock generator 200. The phase information generator 300 may compare a phase of the reference clock CK and phases of the clocks CLK, and may generate the phase information PI as the comparison result. In an exemplary embodiment of the inventive concept, the phase information generator 300 may generate the phase information PI by determining whether the phase of the reference clock CK is substantially the same as a phase of at least one of the plurality of clocks CLK. The generated phase information PI may be provided to the data output circuit 100.

The data output circuit 100 may convert parallel data to serial data by using the plurality of clocks CLK provided from the clock generator 200 and the phase information PI provided from the phase information generator 300, and may output the data "DATA" as the conversion result.

Figure 2:
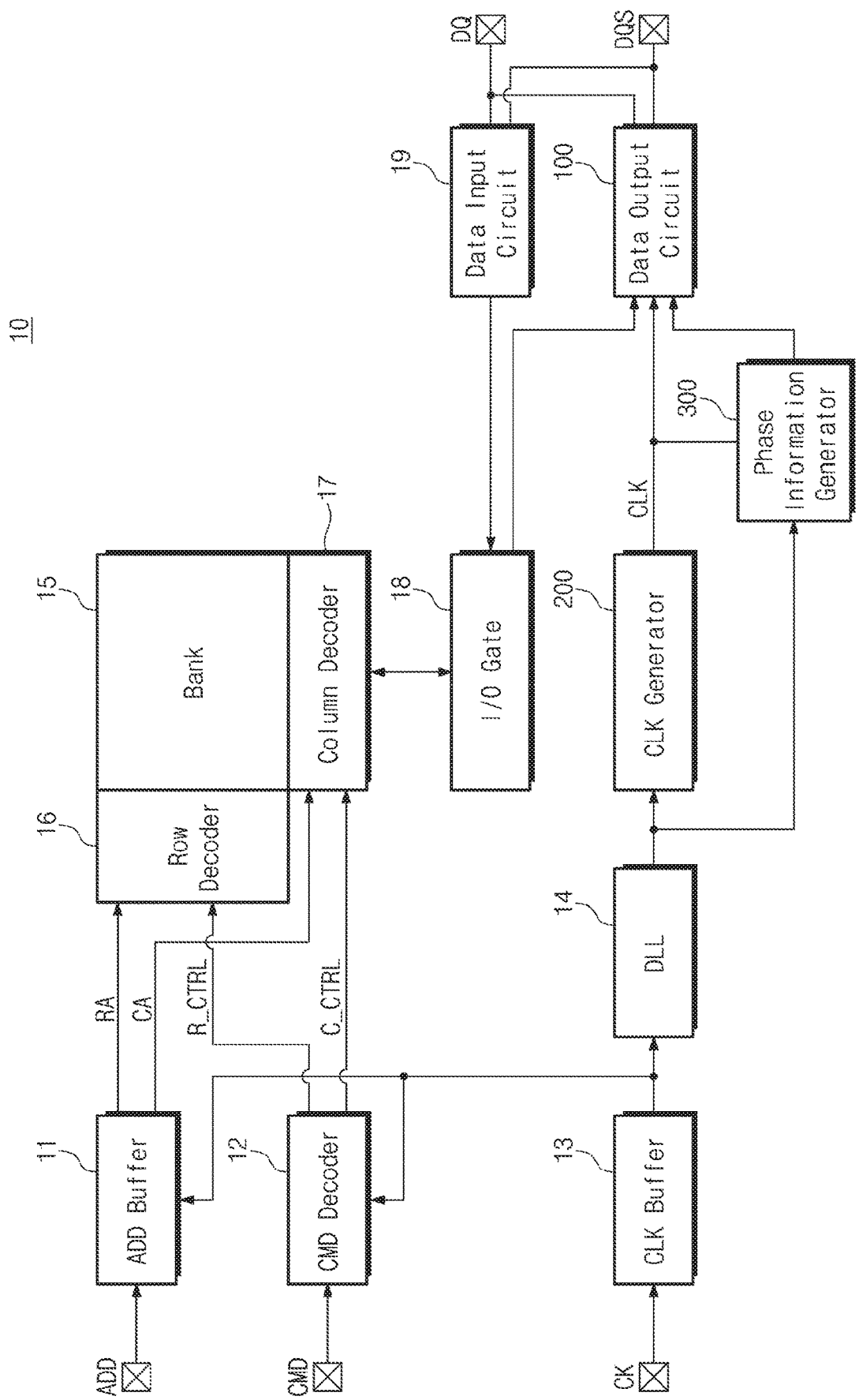
FIG. 2 illustrates a block diagram of the memory device of FIG. 1 according to an exemplary embodiment of the inventive concept.

FIG. 2 illustrates a block diagram of the memory device of FIG. 1 according to an exemplary embodiment of the inventive concept. Referring to FIG. 2, the memory device 10 may include an address buffer 11, a command decoder 12, a clock buffer 13, a delay locked loop (DLL) 14, a bank 15, a row decoder 16, a column decoder 17, an input/output gate 18, the clock generator 200, the phase information generator 300, a data input circuit 19, and the data output circuit 100.

The address buffer 11 may receive an address ADD from the outside through an address pad. The address buffer 11 may operate in synchronization with a clock output from the clock buffer 13. The address buffer 11 may transmit a row address RA and a column address CA to the row decoder 16 and the column decoder 17, respectively.

The command decoder 12 may receive various commands CMD (e.g., the data read command CMD of FIG. 1) from the outside through a command pad. The command decoder 12 may operate in synchronization with the clock output from the clock buffer 13. In an exemplary embodiment of the inventive concept, the command CMD may include an activate command, a read command, or a write command. The command decoder 12 may decode a write enable signal WE, a row address strobe signal RAS, a column address strobe signal CAS, an active signal ACT, a chip select signal CS, or the like. The command decoder 12 may decode the command CMD and may generate a row decoder control signal R_CTRL and a column decoder control signal C_CTRL.

The delay locked loop 14 may compensate for a delay that occurs until the reference clock CK is output as a data bus strobe DQS.

The bank 15 may be a memory cell array. For brevity of illustration, one bank 15 is illustrated in FIG. 2, but the memory device 10 may include a plurality of banks. The size of the bank 15 or the number of banks may be determined in compliance with a protocol or specification. The bank 15 may be controlled by the row decoder 16 and the column decoder 17.

The row decoder 16 may activate a word line in response to the row address RA and the row decoder control signal R_CTRL. In detail, the row decoder 16 may select a word line when the memory device 10 receives an activate command from the outside.

The column decoder 17 may activate a bit line in response to the column address CA and the column decoder control signal C_CTRL. In detail, when the memory device 10 receives a read command or a write command from the outside, the column decoder 17 may select a bit line intersecting the selected word line.

The input/output gate 18 may write data in a memory cell disposed at an intersection of the selected word line and the selected bit line. In this case, the input/output gate 18 may receive write data from the data input circuit 19. The input/output gate 18 may read data from the memory cell disposed at the intersection of the selected word line and the selected bit line. In this case, the input/output gate 18 may transmit the read data to the data output circuit 100.

The clock generator 200 may receive the reference clock CK from the delay locked loop 14, and may generate the plurality of clocks CLK, based on the reference clock CK. The clock generator 200 may generate the plurality of clocks CLK and may provide the generated clocks CLK to the data output circuit 100 and the phase information generator 300.

The phase information generator 300 may receive the reference clock CK from the delay locked loop 14 and the plurality of clocks CLK from the clock generator 200. The phase information generator 300 may compare a phase of the reference clock CK and phases of the clocks CLK, and may generate the phase information PI as the comparison result. In an exemplary embodiment of the inventive concept, the phase information generator 300 may determine whether the phase of the reference clock CK is substantially the same as a phase of at least one of the plurality of clocks CLK, and may generate the phase information PI, based on the determined result.

The data input circuit 19 may transmit write data received through a data pad to the input/output gate 18. In this case, the data input circuit 19 may receive the data bus strobe DQS through a data bus strobe pad together with the write data.

The data output circuit 100 may output read data through the data pad. The data output circuit 100 may be provided with the read data from the input/output gate 18. In an exemplary embodiment of the inventive concept, the read data provided to the data output circuit 100 may be parallel data in form. The data output circuit 100 may serialize the read data in the form of serial data and may then output the read data. In this case, the data output circuit 100 may output the data bus strobe DQS through the data bus strobe pad. Here, the write data and the read data may be referred to by the reference numeral DQ.

The data output circuit 100 may output the read data, based on the plurality of clocks CLK provided from the clock generator 200 and the phase information PI provided from the phase information generator 300.

Figure 3:
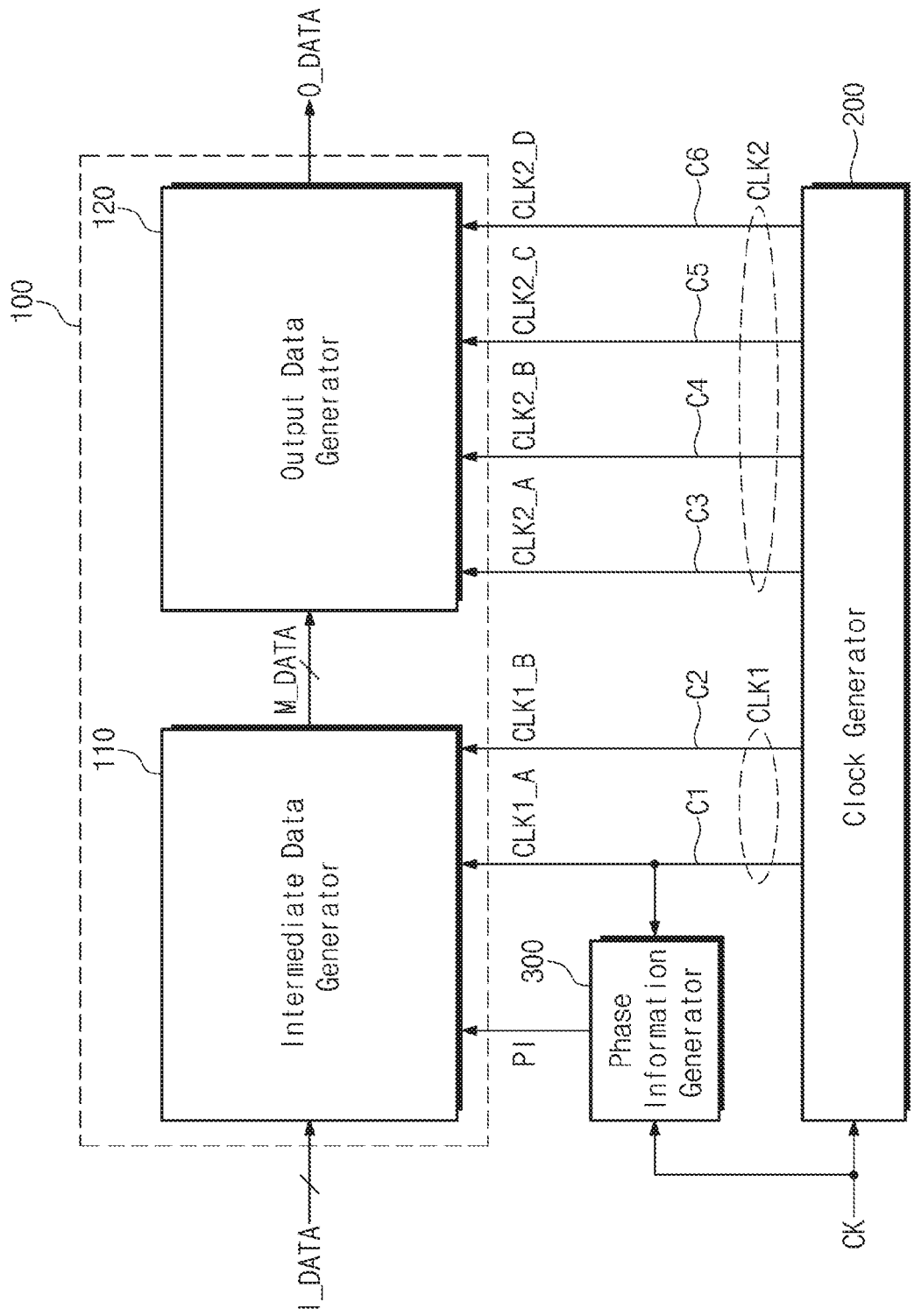
FIG. 3 illustrates a block diagram of a data output circuit of the memory device of FIG. 1 according to an exemplary embodiment of the inventive concept.

FIG. 3 illustrates a block diagram of a data output circuit of the memory device of FIG. 1 according to an exemplary embodiment of the inventive concept. In FIG. 3, for convenience of description, the remaining components other than the data output circuit 100, the clock generator 200, and the phase information generator 300 are omitted.

Referring to FIG. 3, the data output circuit 100 may generate output data O_DATA by serializing a plurality of input data I_DATA input in parallel, and may output the output data O_DATA thus generated. The input data I_DATA may be data (e.g., in the form of parallel data) that are input to the data output circuit 100 from memory cells through a plurality of data lines. The output data O_DATA may be data (e.g., in the form of serial data) that are obtained by aligning the input data I_DATA in the form of a data stream. The output data O_DATA may be provided to the outside of the memory device 10 through one data line.

The clock generator 200 may generate first clocks CLK1 and second clocks CLK2, based on the reference clock CK. In an exemplary embodiment of the inventive concept, the clock generator 200 may generate the first clocks CLK1 having a first frequency that is substantially the same as a frequency of the reference clock CK. The clock generator 200 may generate the second clocks CLK2 having a second frequency that is different from the frequency of the first clocks CLK1. In an exemplary embodiment of the inventive concept, the second frequency of the second clocks CLK2 may be approximately two times higher than the first frequency of the first clocks CLK1.

The first clocks CLK1 may include two first clocks CLK1_A and CLK1_B. The clock generator 200 may provide the data output circuit 100 with the first clock CLK1_A and the first clock CLK1_B through a first clock line C1 and a second clock line C2, respectively. In an exemplary embodiment of the inventive concept, a phase difference of the first clock CLK1_A and the first clock CLK1_B may be about 90 degrees, and one of the first clock CLK1_A and the first clock CLK1_B may have substantially the same phase as the reference clock CK.

The second clocks CLK2 may include four second clocks CLK2_A to CLK2_D. The clock generator 200 may provide the data output circuit 100 with the second clock CLK2_A to the second clock CLK2_D through a third clock line C3 to a sixth clock line C6, respectively. In an exemplary embodiment of the inventive concept, a phase difference between each of the second clocks CLK2_A to CLK2_D may be about 90 degrees, and the second clock CLK2_A may have substantially the same phase as the first clock CLK1_A.

The phase information generator 300 may receive the first clock CLK1_A and the reference clock CK. The phase information generator 300 may compare a phase of the first clock CLK1_A and a phase of the reference clock CK and may generate the phase information PI as the comparison result. The phase information generator 300 may provide the phase information PI to the data output circuit 100. For example, when the phase of the first clock CLK1_A is substantially the same as the phase of the reference clock CK, the phase information PI may be "0"; when the phase of the first clock CLK1_A is different from the phase of the reference clock CK, the phase information PI may be "1".

Alternatively, the phase information generator 300 may compare a phase of at least one of the first clock CLK1_B and the second clocks CLK2_A to CLK2_D with the phase of the reference clock CK, and may generate the phase information PI as the comparison result. In other words, the phase information generator 300 according to an exemplary embodiment of the inventive concept may compare a phase of at least one of the plurality of clocks CLK generated in the clock generator 200 with the phase of the reference clock CK and may generate the phase information PI as the comparison result.

Below, for convenience of description, it is assumed that the phase information generator 300 compare a phase of the first clock CLK1_A and a phase of the reference clock CK, and generates the phase information PI as the comparison result.

Additionally, as illustrated in FIG. 3, the phase information generator 300 may be independent of the clock generator 200, but the inventive concept is not limited thereto. For example, the phase information generator 300 may be placed within the clock generator 200.

The data output circuit 100 may include an intermediate data generator 110 and an output data generator 120. The intermediate data generator 110 may receive the input data I_DATA, the first clocks CLK1, and the phase information PI. The intermediate data generator 110 may convert the input data I_DATA, based on the first clocks CLK1 and the phase information PI, and may output the converted data as intermediate data M_DATA.

For example, the intermediate data generator 110 may convert a part of the input data I_DATA received through a plurality of input data lines to serialized data. As such, the intermediate data generator 110 may output a plurality of intermediate data M_DATA through data lines, the number of which is less than the number of input data lines.

For example, the intermediate data generator 110 may swap data, based on the phase information PI. In the case where data are swapped, data lines through which each of the plurality of intermediate data M_DATA is output may vary. In other words, data lines through which each of the plurality of intermediate data M_DATA is output may vary with the phase information PI.

The output data generator 120 may receive the intermediate data M_DATA and the second clocks CLK2. The output data generator 120 may generate the output data O_DATA, based on the second clocks CLK2. The output data generator 120 may generate the output data O_DATA through one data line. In an exemplary embodiment of the inventive concept, the output data generator 120 may align the plurality of intermediate data M_DATA, based on the second clocks CLK2, and may generate the output data O_DATA from the aligned data.

Figure 4A:
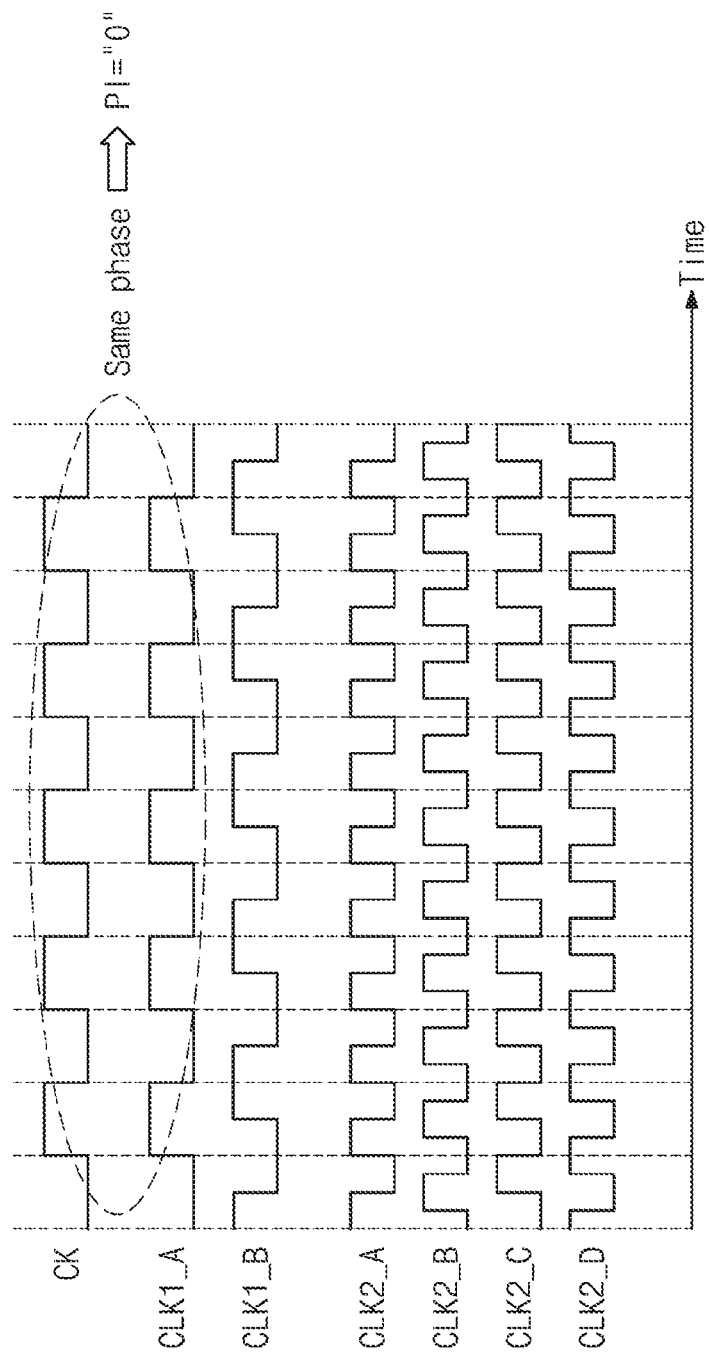

FIGS. 4A and 4B illustrate views of clocks generated from a clock generator of FIG. 3 according to an exemplary embodiment of the inventive concept. In detail, FIG. 4A is an example where the first clock CLK1_A, the phase of which is substantially the same as the phase of the reference clock CK, is generated, and FIG. 4B is an example where the first clock CLK1_A, the phase of which is different from the phase of the reference clock CK, is generated.

As illustrated in FIGS. 4A and 4B, a phase of one of the first clocks CLK1_A and CLK1_B may be substantially the same as the phase of the reference clock CK, and a phase difference between the first clock CLK1_A and the first clock CLK1_B may be about 90 degrees. A frequency of each of the first clock CLK1_A and the first clock CLK1_B may be substantially the same as a frequency of the reference clock CK.

The phase of the second clock CLK2_A may be substantially the same as a phase of the first clock CLK1_A or may be matched with the phase of the first clock CLK1_A. The second clocks CLK2_A to CLK2_D may have a phase difference of about 90 degrees. For example, a phase difference of the second clocks CLK2_A and CLK2_B may be about 90 degrees, a phase difference of the second clocks CLK2_B and CLK2_C may be about 90 degrees, and a phase difference of the second clocks CLK2_C and CLK2_D may be about 90 degrees. A frequency of the second clocks CLK2_A to CLK2_D may be two times higher than a frequency of the reference clock CK and the first clocks CLK1.

Referring to FIGS. 3 and 4A, the clock generator 200 may generate the first clock CLK1_A having substantially the same phase as the reference clock CK and may generate the first clock CLK1_B, the phase of which is delayed by about 90 degrees with respect to the first clock CLK1_A. Since the phase of the reference clock CK is substantially the same as the phase of the first clock CLK1_A, the phase information generator 300 may generate the phase information PI of "0".

The clock generator 200 may generate the second clock CLK2_A, the phase of which is matched with the phase of the first clock CLK1_A, and may generate the second clocks CLK2_B to CLK2_D, the phases of which are delayed by about 90 degrees.

Referring to FIGS. 3 and 4B, the clock generator 200 may generate the first clock CLK1_A, the phase of which is delayed by about 90 degrees with respect to the reference clock CK, and may generate the first clock CLK1_B having substantially the same phase as the reference clock CK. Since the phase of the reference clock CK is different from the phase of the first clock CLK1_A, the phase information generator 300 may generate the phase information PI of "1".

The clock generator 200 may generate the second clock CLK2_A, the phase of which is matched with the phase of the first clock CLK1_A, and may generate the second clocks CLK2_B to CLK2_D, the phases of which are delayed by about 90 degrees.

An example is described with reference to FIGS. 3 and 4B where the clock generator 200 generates the two clocks CLK1_A and CLK1_B as the first clocks CLK1 and generates the four clocks CLK2_A to CLK2_D as the second clocks CLK2. However, the inventive concept is not limited thereto. In an exemplary embodiment of the inventive concept, the clock generator 200 may generate the first clocks CLK1 and the second clocks CLK2, the numbers of which vary with a configuration and an operating characteristic of the data output circuit 100. For example, the clock generator 200 may generate the first clocks CLK1 and the second clocks CLK2, the numbers of which vary with the number of data lines through which the input data I_DATA are input.

Figure 5:
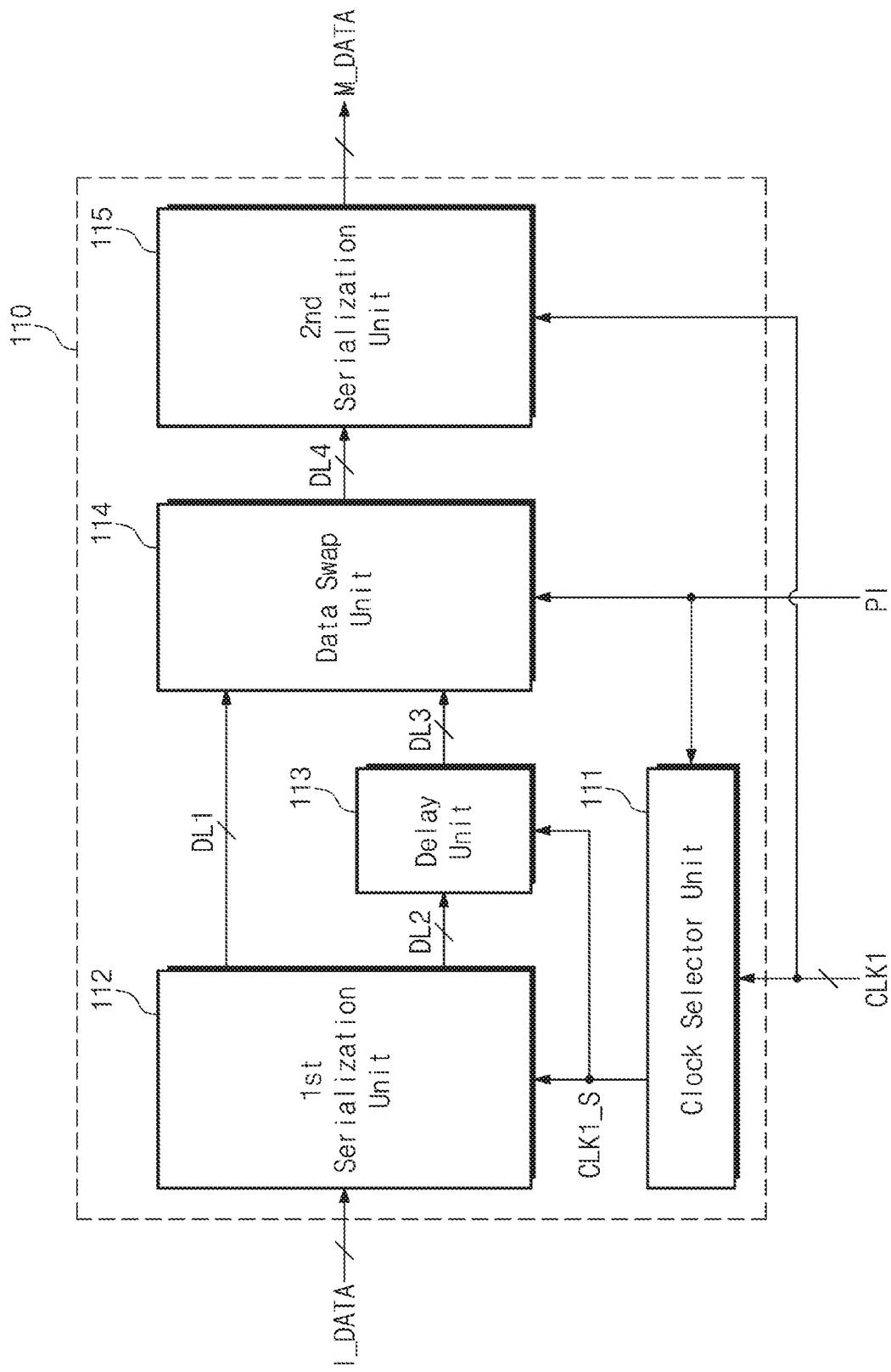
FIG. 5 illustrates a block diagram of an intermediate data generator of FIG. 3 according to an exemplary embodiment of the inventive concept.

FIG. 5 illustrates a block diagram of an intermediate data generator of FIG. 3 according to an exemplary embodiment of the inventive concept. Referring to FIGS. 3 and 5, the intermediate data generator 110 may include a clock selector unit 111, a first serialization unit 112, a delay unit 113, a data swap unit 114, and a second serialization unit 115, each of which may be a circuit.

The clock selector unit 111 may receive the first clocks CLK1 and the phase information PI. For example, as illustrated in FIGS. 4A and 4B, the first clocks CLK1 may include a plurality of clocks (e.g., the first clock CLK1_A and the first clock CLK1_B) that have substantially the same frequency and different phases.

The clock selector unit 111 may select one of the first clocks CLK1, based on the phase information PI. For example, as illustrated in FIG. 3, the phase information PI may be generated from the result of comparing the phase of the first clock CLK1_A and the phase of the reference clock CK. When the phase information PI is "0" (e.g., when the phase of the first clock CLK1_A is substantially the same as the phase of the reference clock CK), the clock selector unit 111 may select the first clock CLK1_A. When the phase information PI is "1" (e.g., when the phase of the first clock CLK1_A is different from the phase of the reference clock CK), the clock selector unit 111 may select the first clock CLK1_B.

The clock selector unit 111 may provide a first clock CLK1_S selected according to the phase information PI to the first serialization unit 112 and the delay unit 113.

The first serialization unit 112 may receive the input data I_DATA and the selected first clock CLK1_S. The first serialization unit 112 may serialize the input data I_DATA received through a plurality of input data lines, based on the selected first clock CLK1_S. For example, when the input data I_DATA are transmitted through 16 input data lines, the first serialization unit 112 may serialize the input data I_DATA and may output the serialized data through 8 data lines.

The first serialization unit 112 may output a first part of the serialized data through first data lines DL1 and may output a second part (e.g., the rest) of the serialized data through second data lines DL2. In an exemplary embodiment of the inventive concept, the number of the first data lines DL1 may be the same as the number of the second data lines DL2.

The delay unit 113 may receive the second part of the serialized data from the second data lines DL2 and may receive the selected first clock CLK1_S from the clock selector unit 111. The delay unit 113 may delay data input through the second data lines DL2 for a predetermined time and may output the delayed data to third data lines DL3. For example, the delay unit 113 may delay a phase of data input through the second data lines DL2 by about 90 degrees and may output data of the delayed phase to the third data lines DL3.

The data swap unit 114 may receive data through the first data lines DL1 and the third data lines DL3. The data swap unit 114 may receive the phase information PI from the phase information generator 300. The data swap unit 114 may swap the data input through the first data lines DL1 and the third data lines DL3, based on the phase information PI. By swapping the data, the data swap unit 114 may change data lines through which the data input to the first data lines DL1 are output, and data lines through which the data input to the third data lines DL3 are output.

The data swap unit 114 may output the swapped data through fourth data lines DL4. As such, the fourth data lines DL4 through which the data input to the first data lines DL1 and the third data lines DL3 are output may be changed according to the data swap result.

For example, when the phase information PI is "0", the data swap unit 114 may output the input data without swapping. When the phase information PI is "1", the data swap unit 114 may swap and output the input data. Accordingly, the input data may be output through other data lines depending on the data swap result.

The second serialization unit 115 may receive data from the fourth data lines DL4. The second serialization unit 115 may receive the first clocks CLK1 from the clock generator 200. The second serialization unit 115 may serialize data input through the fourth data lines DL4, based on the first clocks CLK1. For example, when data are transmitted through eight fourth data lines DL4, the second serialization unit 115 may serialize the data and may output the serialized data through four data lines. The output data may be provided to the output data generator 120 of FIG. 3 as the intermediate data M_DATA.

As described above, the data output circuit 100 may swap the intermediate data M_DATA, which are generated in the process of converting parallel data to serial data, based on the phase information PI of provided clocks. Even though phases of clocks varies, since the phase of data and the phases of clocks are matched by swapping the data, the data swap unit 114 may output the same serial data regardless of the phases of the clocks. This may mean that the data output circuit 100 does not include a separate circuit for adjusting phases of clocks.

Figure 6:
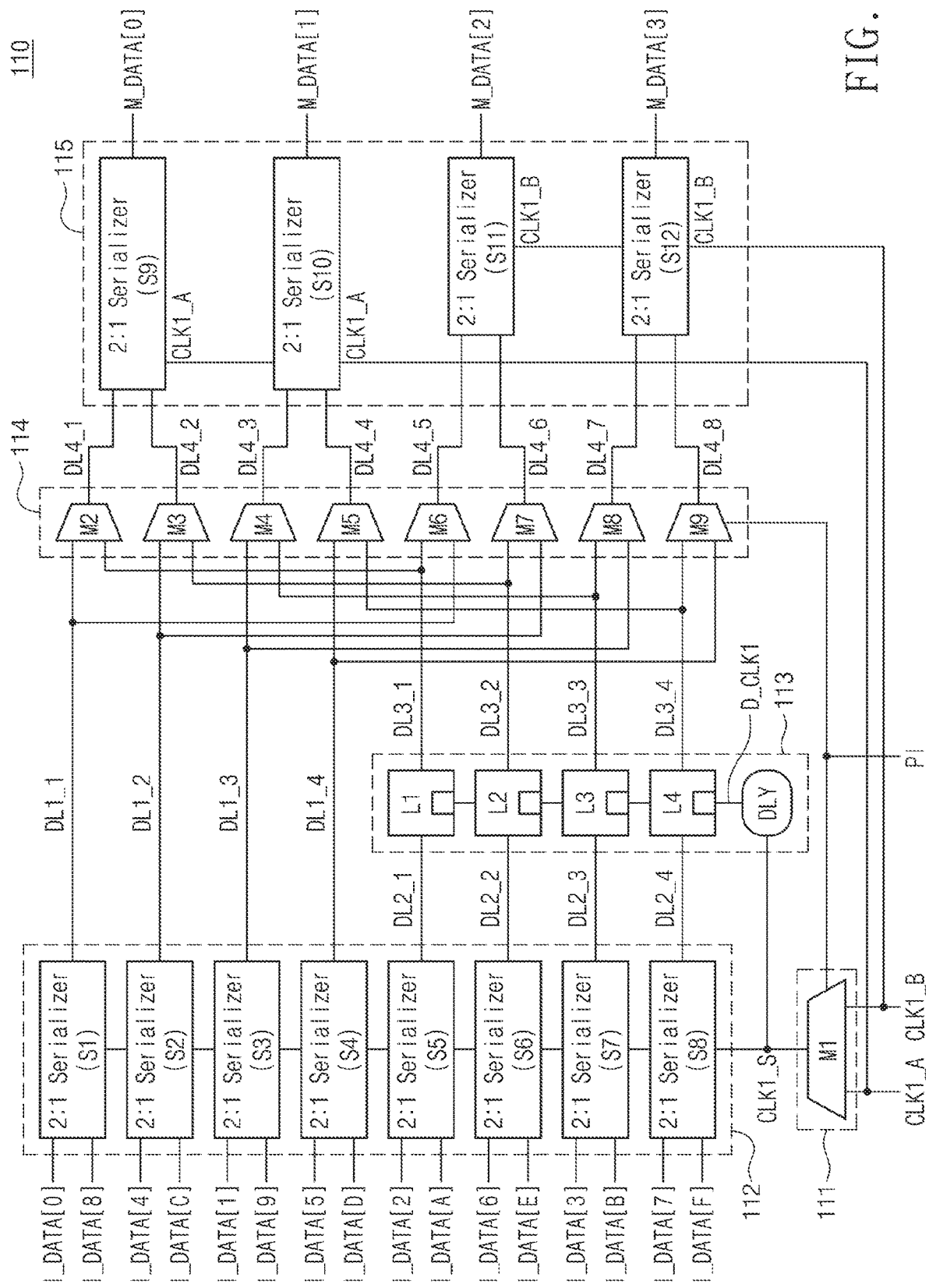
FIG. 6 illustrates a view associated with implementation of the intermediate data generator of FIG. 5 according to an exemplary embodiment of the inventive concept.

FIG. 6 illustrates a view associated with implementation of an intermediate data generator of FIG. 5 according to an exemplary embodiment of the inventive concept. Referring to FIGS. 5 and 6, the clock selector unit 111 may include a first multiplexer M1. The first multiplexer M1 may receive the phase information PI as a control input. The first multiplexer M1 may select one of the first clock CLK1_A or the first clock CLK1_B based on the phase information PI, to output the selected first clock CLK1_S.

For example, the phase information PI may be generated from the result of comparing the phase of the first clock CLK1_A and the phase of the reference clock CK, and the first multiplexer M1 may output the first clock CLK1_A as the selected first clock CLK1_S when the phase information PI is "0". The first multiplexer M1 may output the first clock CLK1_B as the selected first clock CLK1_S when the phase information PI is "1".

Alternatively, the phase information PI may be generated from the result of comparing the phase of the first clock CLK1_B and the phase of the reference clock CK, and the first multiplexer M1 may output the first clock CLK1_B as the selected first clock CLK1_S when the phase information PI is "0". The first multiplexer M1 may output the first clock CLK1_A as the selected first clock CLK1_S when the phase information PI is "1".

The first serialization unit 112 may include a plurality of 2:1 serializers. The first serialization unit 112 may include first to eighth serializers S1 to S8. Each of the first to eighth serializers S1 to S8 may receive two input data. Each of the first to eighth serializers S1 to S8 may serialize two input data, based on the selected first clock CLK1_S. The first to eighth serializers S1 to S8 may output the serialized data through a plurality of first data lines DL1_1 to DL1_4 and a plurality of second data lines DL2_1 to DL2_4.

For example, the first serializer S1 may receive 0-th input data I_DATA[0] and eighth input data I_DATA[8] through two input data lines. The first serializer S1 may serialize the 0-th input data I_DATA[0] and the eighth input data I_DATA[8] and may output the serialized data through the first data line DL1_1. In this case, the 0-th input data I_DATA[0] may be output prior to the eighth input data I_DATA[8].

As such, the first serialization unit 112 may serialize input data I_DATA[0] to I_DATA[F] input through sixteenth different data lines and may output the serialized data through eight different data lines (e.g., the first data lines DL1_1 to DL1_4 and the second data lines DL2_1 to DL2_4).

The data output through the first data lines DL1_1 to DL1_4 may be provided to the data swap unit 114. The data output through the second data lines DL2_1 to DL2_4 may be provided to the data swap unit 114 through the delay unit 113.

The delay unit 113 may include first to fourth latches L1 to L4 and a delay circuit DLY. The delay circuit DLY may delay the selected first clock CLK1_S for a predetermined time. For example, the delay circuit DLY may delay the selected first clock CLK1_S such that a phase of the selected first clock CLK1_S is delayed by about 90 degrees.

A first clock D_CLK1 delayed by the delay circuit DLY may be provided to the first to fourth latches L1 to L4 as a control input. The first to fourth latches L1 to L4 may operate based on the delayed first clock D_CLK1. The first to fourth latches L1 to L4 may respectively store data input from the second data lines DL2_1 to DL2_4. The first to fourth latches L1 to L4 may output the stored data when a value of the delayed first clock D_CLK1 is high. The first to fourth latches L1 to L4 may respectively output the stored data through third data lines DL3_1 to DL3_4.

As understood from the above description, the data output through the third data lines DL3_1 to DL3_4 may be delayed by a predetermined time compared with the data output through the first data lines DL1_1 to DL1_4.

The data swap unit 114 may include second to ninth multiplexers M2 to M9. The second to ninth multiplexers M2 to M9 may receive data through the first data lines DL1_1 to DL1_4 and the third data lines DL3_1 to DL3_4. Each of the second to ninth multiplexers M2 to M9 may receive the phase information PI as a control input. The second to ninth multiplexers M2 to M9 may output one of data input from the first data lines DL1_1 to DL1_4 and the third data lines DL3_1 to DL3_4 to the fourth data lines DL4_1 to DL4_8, based on the phase information PI.

For example, the second multiplexer M2 may receive data from the first data line DL1_1 and the third data line DL3_1, respectively. When the phase information PI is "0", the second multiplexer M2 may output data input from the first data line DL1_1 to the fourth data line DL4_1. When the phase information PI is "1", the second multiplexer M2 may output data input from the third data line DL3_1 to the fourth data line DL4_1.

Like the second multiplexer M2, the sixth multiplexer M6 may receive data from the first data line DL1_1 and the third data line DL3_1, respectively. When the phase information PI is "0", the sixth multiplexer M6 may output data input from the third data line DL3_1 to the fourth data line DL4_5. When the phase information PI is "1", the sixth multiplexer M6 may output data input from the first data line DL1_1 to the fourth data line DL4_5.

Likewise, each of the third multiplexer M3 and the seventh multiplexer M7 may receive the same data from the first data line DL1_2 and the third data line DL3_2. The third multiplexer M3 may output one of two input data to the fourth data lines DL4_2 depending on the phase information PI, and the seventh multiplexer M7 may output one of two input data to the fourth data line DL4_6 depending on the phase information PI.

Each of the fourth multiplexer M4 and the eighth multiplexer M8 may receive the same data, the fourth multiplexer M4 may output one of two input data to the fourth data line DL4_3 depending on the phase information PI, and the eighth multiplexer M8 may output one of two input data to the fourth data line DL4_7 depending on the phase information PI.

Each of the fifth multiplexer M5 and the ninth multiplexer M9 may receive the same data, the fifth multiplexer M5 may output one of two input data to the fourth data line DL4_4 depending on the phase information PI, and the ninth multiplexer M9 may output one of two input data to the fourth data line DL4_8 depending on the phase information PI.

Accordingly, the data swap unit 114 may change a data line, through which data are output, depending on the phase information PI. For example, when the phase information PI is "0", the data swap unit 114 may output data input through the first data lines DL1_1 to DL1_4 to the fourth data lines DL4_1 to DL4_4 and may output data input through the third data lines DL3_1 to DL3_4 to the fourth data lines DL4_5 to DL4_8. When the phase information PI is "1", the data swap unit 114 may output data input through the first data lines DL1_1 to DL1_4 to the fourth data lines DL4_5 to DL4_8 and may output data input through the third data lines DL3_1 to DL3_4 to the fourth data lines DL4_1 to DL4_4.

As described above, the data swap unit 114 may swap data, based on the phase information PI of the first and second clocks CLK1 and CLK2 provided to the data output circuit 100. The data swap unit 114 may swap data such that a phase of data not delayed (e.g., data input through the first data lines DL1) and data delayed by a given time (e.g., data input through the third data lines DL3) are matched with a phase of the first and second clocks CLK1 and CLK2.

The second serialization unit 115 may include ninth to twelfth serializers S9 to S12. Each of the ninth to twelfth serializers S9 to S12 may be implemented with a 2:1 serializer that aligns data through two data lines and outputs the aligned data to one data line. Data output through the ninth to twelfth serializers S9 to S12 may be output as 0-th to third intermediate data M_DATA[0] to M_DATA[3], respectively.

Each of the ninth and tenth serializers S9 and S10 may serialize input data, based on the first clock CLK1_A. For example, the ninth serializer S9 may serialize data input through the fourth data lines DL4_1 to DL4_2 and may output the serialized data as the 0-th intermediate data M_DATA[0]. As such, the tenth serializer S10 may output the first intermediate data M_DATA[1], based on the first clock CLK1_A.

For example, each of the eleventh and twelfth serializers S11 and S12 may serialize input data, based on the first clock CLK1_B. The eleventh serializer S11 may serialize data input through the fourth data lines DL4_5 to DL4_6 and may output the serialized data as the second intermediate data M_DATA[2]. As such, the twelfth serializer S12 may output the third intermediate data M_DATA[3], based on the first clock CLK1_B.

As described above, the data swap unit 114 may swap data, based on a phase of the first clocks CLK1_A and CLK1_B provided to the second serialization unit 115. The phase of the first clocks CLK1_A and CLK1_B and a phase of data may be matched by swapping data input to the second serialization unit 115 when the phase of the first clocks CLK1_A and CLK1_B provided to the second serialization unit 115 varies. In other words, the first clocks CLK1_A and CLK1_B may be provided to the second serialization unit 115 without separate processing (e.g., muxing), and the second serialization unit 115 may serialize data by using the provided first clocks CLK1_A and CLK1_B without modification.

As described above, an example of the data output circuit 100 according to an exemplary embodiment of the inventive concept is described with reference to FIG. 6, and the inventive concept is not limited thereto. For example, circuits illustrated in FIG. 6 may be replaced with other circuits, and the number of data lines and the number of circuits may be variously changed.

Figure 7A:
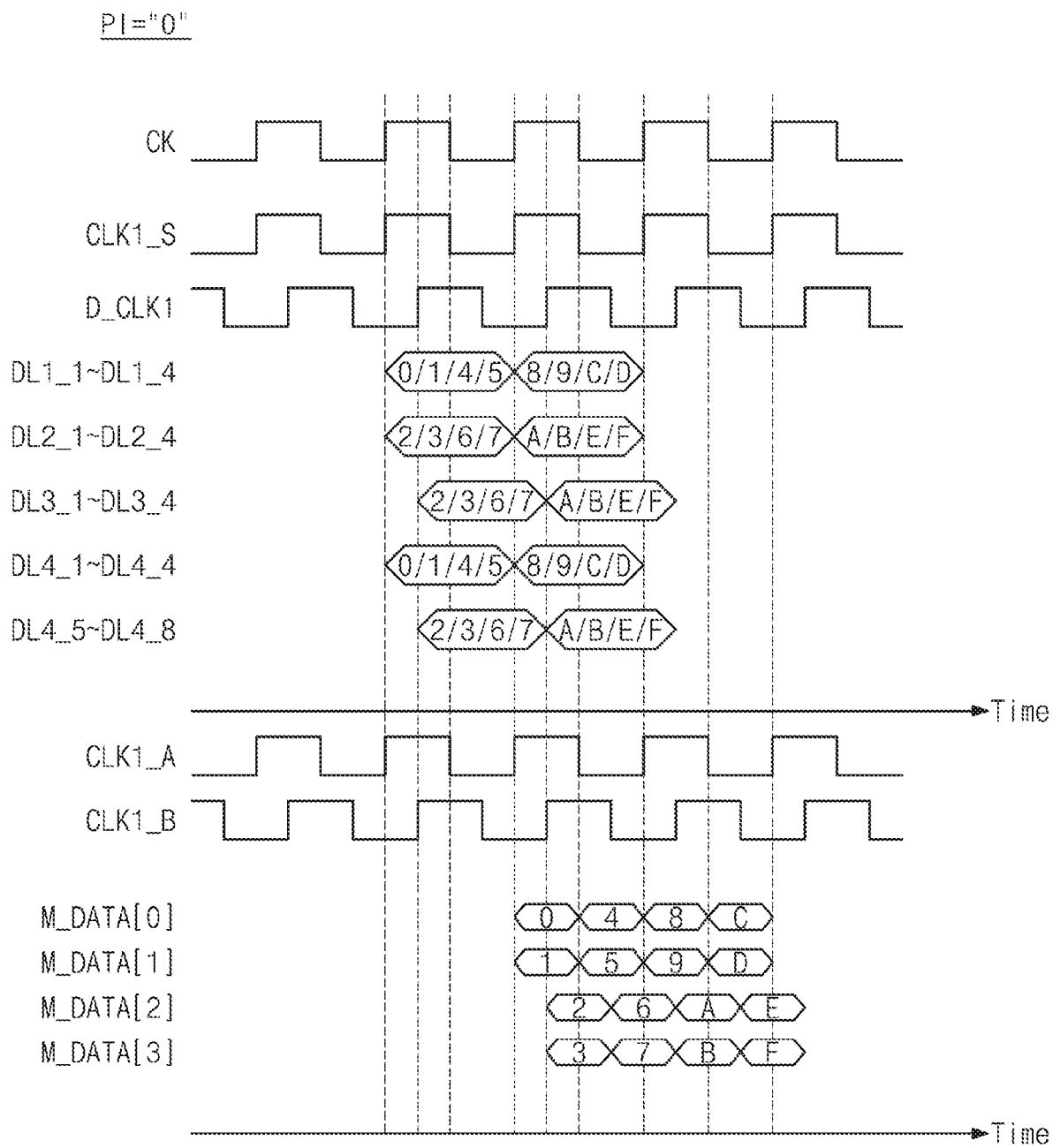
FIGS. 7A and 7B illustrate timing diagrams of data outputs of FIG. 6 according to an exemplary embodiment of the inventive concept.
Figure 7B:
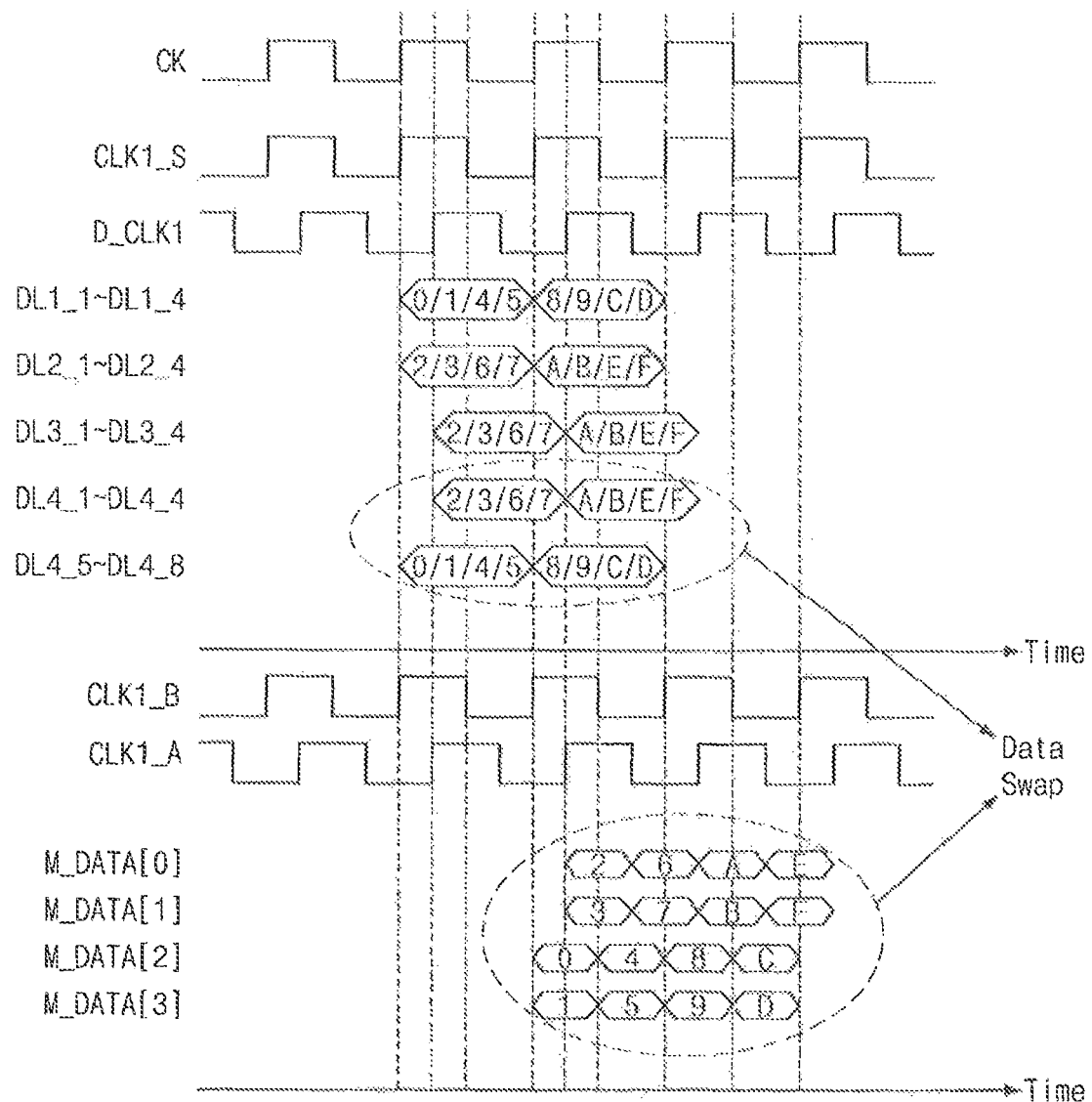

FIGS. 7A and 7B illustrate timing diagrams of data outputs of FIG. 6 according to an exemplary embodiment of the inventive concept. In detail, FIG. 7A indicates data outputs of FIG. 6 when the phase information PI is "0", and FIG. 7B indicates data outputs of FIG. 6 when the phase information PI is "1".

Referring to FIGS. 6 and 7A, data [0,8], [4,C], [1,9], [5,D], [2,A], [6,E], [3,B], and [7,F] serialized according to the first clock CLK1_S selected by the first serialization unit 112 may be output to the first data lines DL1_1 to DL1_4 and the second data lines DL2_1 to DL2_4. The data [0,8], [4,C], [1,9], and [5,D] serialized by the first to fourth serializers S1 to S4 may be output to the first data lines DL1_1 to DL1_4. The data [2,A], [6,E], [3,B], and [7,F] serialized by the fifth to eighth serializers S5 to S8 may be output to the second data lines DL2_1 to DL2_4.

The data [2,A], [6,E], [3,B], and [7,F] output to the second data lines DL2_1 to DL2_4 may be provided to the third data lines DL3_1 to DL3_4 after being delayed by a given time (e.g., a 90-degree phase) depending on the delayed first clock D_CLK1.

Since the phase information PI is "0" (e.g., since a phase of the reference clock CK is substantially the same as a phase of the first clock CLK1_A provided from the clock generator 200), the data swap unit 114 may output the data [0,8], [4,C], [1,9], and [5,D] input through the first data lines DL1_1 to DL1_4 to the fourth data lines DL4_1 to DL4_4. Additionally, the data swap unit 114 may output the data [2,A], [6,E], [3,B], and [7,F] input through the third data lines DL3_1 to DL3_4 to the fourth data lines DL4_5 to DL4_8.

The second serialization unit 115 may serialize the data [0,8], [4,C], [1,9], [5,D], [2,A], [6,E], [3,B], and [7,F] input through the fourth data lines DL4_1 to DL4_8, based on the first clock CLK1_A and the first clock CLK1_B.

The ninth serializer S9 may serialize the input data [0,8] and [4,C], based on the first clock CLK1_A and may output the serialized data [0, 4, 8, C] as the 0-th intermediate data M_DATA[0]. The tenth serializer S10 may serialize the input data [1,9] and [5,D], based on the first clock CLK1_A and may output the serialized data [1, 5, 9, D] as the first intermediate data M_DATA[1]. The eleventh serializer S11 may serialize the input data [2,A] and [6,E], based on the first clock CLK1_B and may output the serialized data [2, 6, A, E] as the second intermediate data M_DATA[2]. The twelfth serializer S12 may serialize the input data [3,B] and [7,F], based on the first clock CLK1_B and may output the serialized data [3, 7, B, F] as the third intermediate data M_DATA[3].

Referring to FIGS. 6 and 7B, as illustrated in FIG. 7B, data output to the first to third data lines DL1 to DL3 are the same as data described with reference to FIG. 7A.

Since the phase information PI is "1" (e.g., since a phase of the reference clock CK is different from a phase of the first clock CLK1_A provided from the clock generator 200), the data swap unit 114 may output the data [2,A], [6,E], [3,B], and [7,F] input through the third data lines DL3_1 to DL3_4 to the fourth data lines DL4_1 to DL4_4. Additionally, the data swap unit 114 may output the data [0,8], [4,C], [1,9], and [5,D] input through the first data lines DL1_1 to DL1_4 to the fourth data lines DL4_5 to DL4_8. In other words, data output through the fourth data lines DL4_1 to DL4_8 of FIG. 7B may be a swapped version of the data output through the fourth data lines DL4_1 to DL4_8 of FIG. 7A.

The ninth serializer S9 may serialize the input data [2,A] and [6,E], based on the first clock CLK1_A and may output the serialized data [2, 6, A, E] as the 0-th intermediate data M_DATA[0]. The tenth serializer S10 may serialize the input data [3,B] and [7,F], based on the first clock CLK1_A and may output the serialized data [3, 7, B, F] as the first intermediate data M_DATA[1]. The eleventh serializer S11 may serialize the input data [0,8] and [4,C], based on the first clock CLK1_B and may output the serialized data [0, 4, 8, C] as the second intermediate data M_DATA[2]. The twelfth serializer S12 may serialize the input data [1,9] and [5,D], based on the first clock CLK1_B and may output the serialized data [1, 5, 9, D] as the third intermediate data M_DATA[3]. In other words, the intermediate data M_DATA[0] to M_DATA[3] of FIG. 7B output from the second serialization unit 115 may be a swapped version of the intermediate data M_DATA[0] to M_DATA[3] of FIG. 7A output from the second serialization unit 115.

Figure 8:
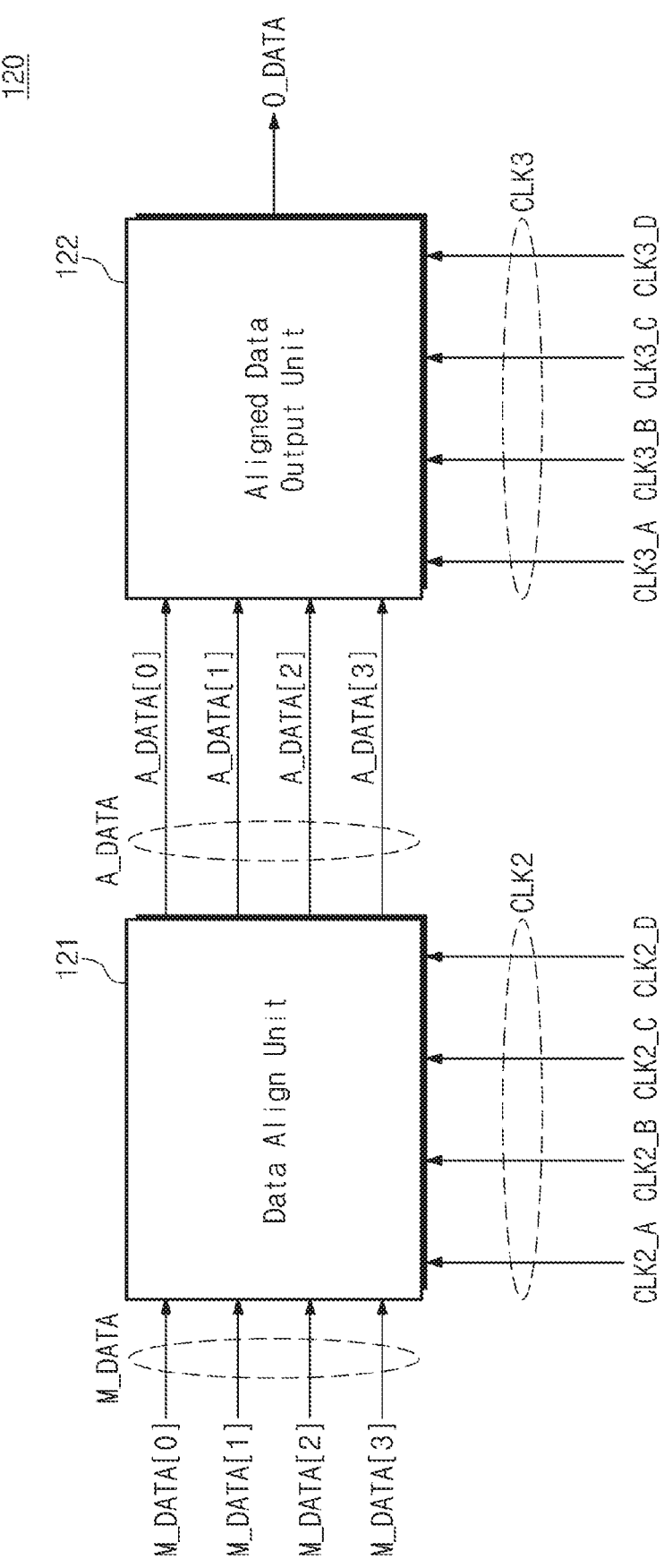
FIG. 8 illustrates a block diagram of an output data generator of FIG. 3 according to an exemplary embodiment of the inventive concept.

FIG. 8 illustrates a block diagram of an output data generator of FIG. 3 according to an exemplary embodiment of the inventive concept. Referring to FIGS. 3 and 8, the output data generator 120 may include a data align unit 121 and an aligned data output unit 122, each of which may be a circuit.

The data align unit 121 may receive the intermediate data M_DATA and the second clocks CLK2. The data align unit 121 may align the intermediate data M_DATA, based on the second clocks CLK2 and may output aligned data A_DATA.

In an exemplary embodiment of the inventive concept, the data align unit 121 may receive the 0-th intermediate data M_DATA[0] to the third intermediate data M_DATA[3] from the intermediate data generator 110. The data align unit 121 may receive the second clocks CLK2_A to CLK2_D from the clock generator 200. The data align unit 121 may align the 0-th intermediate data M_DATA[0] to the third intermediate data M_DATA[3] to output 0-th aligned data A_DATA[0] to third aligned data A_DATA[3]. The 0-th to third aligned data A_DATA[0] to A_DATA[3] thus output may be provided to the aligned data output unit 122.

The data align unit 121 may align the intermediate data M_DATA such that a plurality of intermediate data M_DATA are output at regular time intervals (e.g., a regular phase difference). In other words, the data align unit 121 may make the output times of the plurality of aligned data A_DATA different. In an exemplary embodiment of the inventive concept, the data align unit 121 may align data such that the 0-th intermediate data M_DATA[0] to the third intermediate data M_DATA[3] are output at regular time intervals. For example, the 0-th to third aligned data A_DATA[0] to A_DATA[3] may be output to have a phase difference of about 90 degrees.

The data align unit 121 may include a plurality of flip-flops and a plurality of delay circuits.

The aligned data output unit 122 may receive third clocks CLK3 and the aligned data A_DATA. The aligned data output unit 122 may generate the output data O_DATA by converting the aligned data A_DATA to serialized data (e.g., in the form of a data stream), based on the third clocks CLK3. In other words, the aligned data output unit 122 may output the output data O_DATA through one data line.

The third clocks CLK3 may be generated in the data output circuit 100. In an exemplary embodiment of the inventive concept, the third clocks CLK3 may be generated from the second clocks CLK2. The third clocks CLK3 may include a plurality of clocks that have substantially the same frequency and substantially the same phase as the second clocks CLK2. For example, the third clock CLK3 may include four clocks CLK3_A to CLK3_D having different phases, and each of the clocks CLK3_A to CLK3_D may have substantially the same phase as one of the second clocks CLK2_A to CLK2_D.

In an exemplary embodiment of the inventive concept, the aligned data output unit 122 may receive the 0-th aligned data A_DATA[0] to the third aligned data A_DATA[3] from the data align unit 121. The aligned data output unit 122 may receive the 0-th to third aligned data A_DATA[0] to A_DATA[3], based on the third clocks CLK3_A to CLK3_D. The serialized data may be output as the output data O_DATA.

Figure 9A:
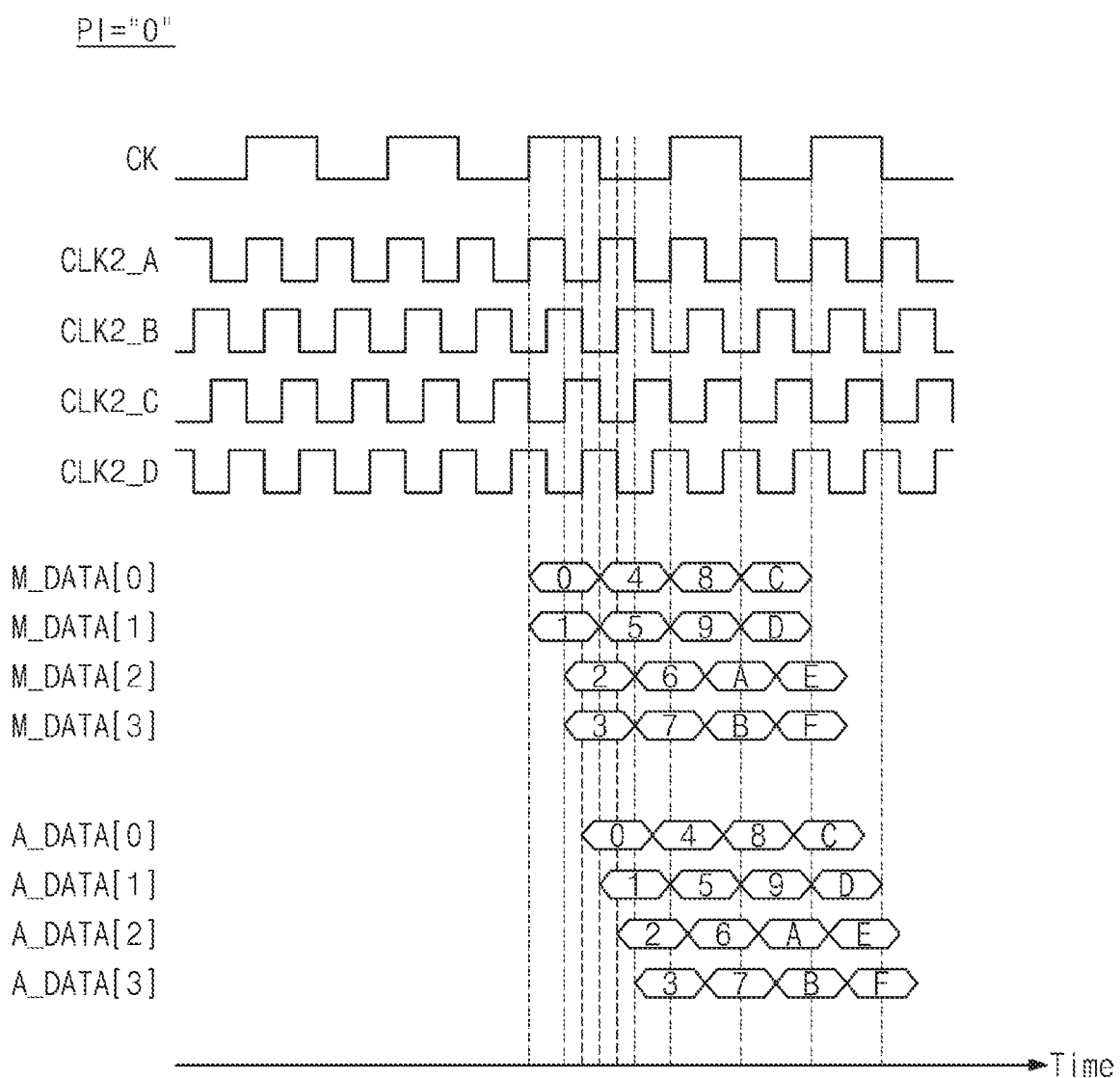
FIGS. 9A and 9B illustrate timing diagrams of a data output of a data align unit of FIG. 8 according to an exemplary embodiment of the inventive concept.
Figure 9B:
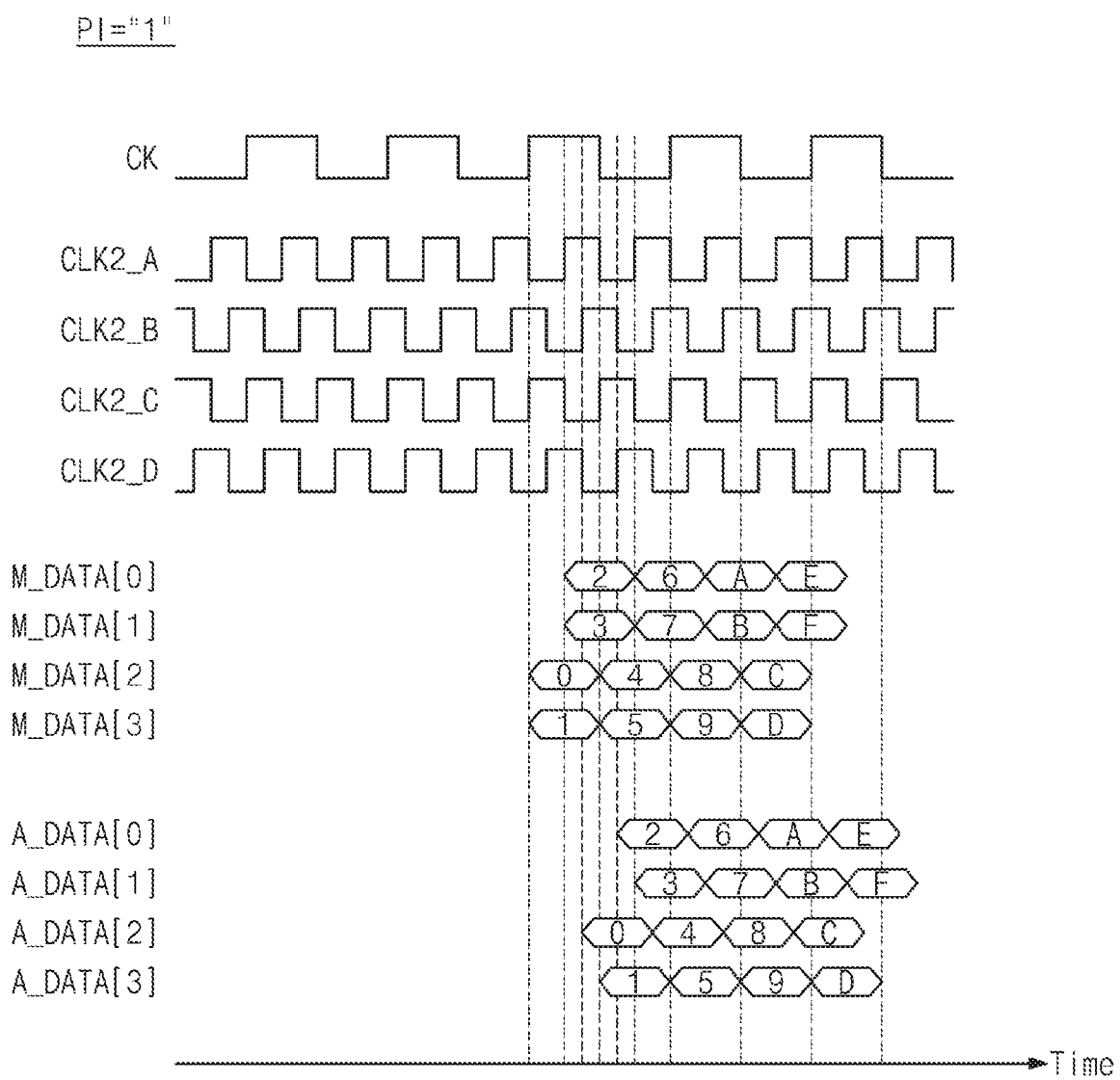

FIGS. 9A and 9B illustrate timing diagrams of a data output of a data align unit of FIG. 8 according to an exemplary embodiment of the inventive concept. In detail, FIG. 9A indicates a data output of FIG. 8 when the phase information PI is "0", and FIG. 9B indicates a data output of FIG. 8 when the phase information PI is "1".

Referring to FIGS. 8 and 9A, phase differences of the second clocks CLK2_A to CLK2_D provided to the data align unit 121 may be about 90 degrees. Since the phase information PI is "0", the data align unit 121 may receive the 0-th intermediate data M_DATA[0] to the third intermediate data M_DATA[3] of FIG. 7A from the intermediate data generator 110.

The data align unit 121 may delay an output of the 0-th intermediate data M_DATA[0] by a given time (e.g., a "¾" period of the second clocks CLK2_A to CLK2_D), based on at least one of the second clocks CLK2_A to CLK2_D. The data align unit 121 may delay an output of the first intermediate data M_DATA[1] by a given time (e.g., the "¾" period of the second clocks CLK2_A to CLK2_D), based on at least one of the second clocks CLK2_A to CLK2_D. The data align unit 121 may delay an output of the second intermediate data M_DATA[2] by a given time (e.g., a "¾"

period of the second clocks CLK2_A to CLK2_D), based on at least one of the second clocks CLK2_A to CLK2_D. The data align unit 121 may delay an output of the third intermediate data M_DATA[3] by a given time (e.g., the "¾" period of the second clocks CLK2_A to CLK2_D), based on at least one of the second clocks CLK2_A to CLK2_D.

Accordingly, the first aligned data A_DATA[1] may be output to be later than the 0-th aligned data A_DATA[0], by a ¼ period of the second clocks CLK2_A to CLK2_D. The second aligned data A_DATA[2] may be output to be later than the 0-th aligned data A_DATA[0], by a ½ period of the second clocks CLK2_A to CLK2_D. The third aligned data A_DATA[3] may be output to be later than the 0-th aligned data A_DATA[0], by a ¾ period of the second clocks CLK2_A to CLK2_D. The 0-th to third aligned data A_DATA[0] to A_DATA[3] output from the data align unit 121 may be aligned as illustrated in FIG. 9A.

Referring to FIGS. 8 and 9B, phase differences of the second clocks CLK2_A to CLK2_D provided to the data align unit 121 may be about 90 degrees. Since the phase information PI is "1", the data align unit 121 may receive the 0-th intermediate data M_DATA[0] to the third intermediate data M_DATA[3] of FIG. 7B from the intermediate data generator 110.

As illustrated in FIG. 9A, the data align unit 121 may delay the 0-th to third intermediate data M_DATA[0] to M_DATA[3] by a given time. The first aligned data A_DATA[1] may be output to be later than the 0-th aligned data A_DATA[0], by a ¼ period of the second clocks CLK2_A to CLK2_D, the second aligned data A_DATA[2] may be output to be earlier than the 0-th aligned data A_DATA[0], by a ½ period of the second clocks CLK2_A to CLK2_D, and the third aligned data A_DATA[3] may be output to be earlier than the 0-th aligned data A_DATA[0], by a ¼ period of the second clocks CLK2_A to CLK2_D. As such, the 0-th to third aligned data A_DATA[0] to A_DATA[3] output from the data align unit 121 may be aligned as illustrated in FIG. 9B.

As illustrated in FIGS. 9A and 9B, the arrangement of data output from the data align unit 121 may vary with the phase information PI of the first and second clocks CLK1 and CLK2.

Figure 10A:
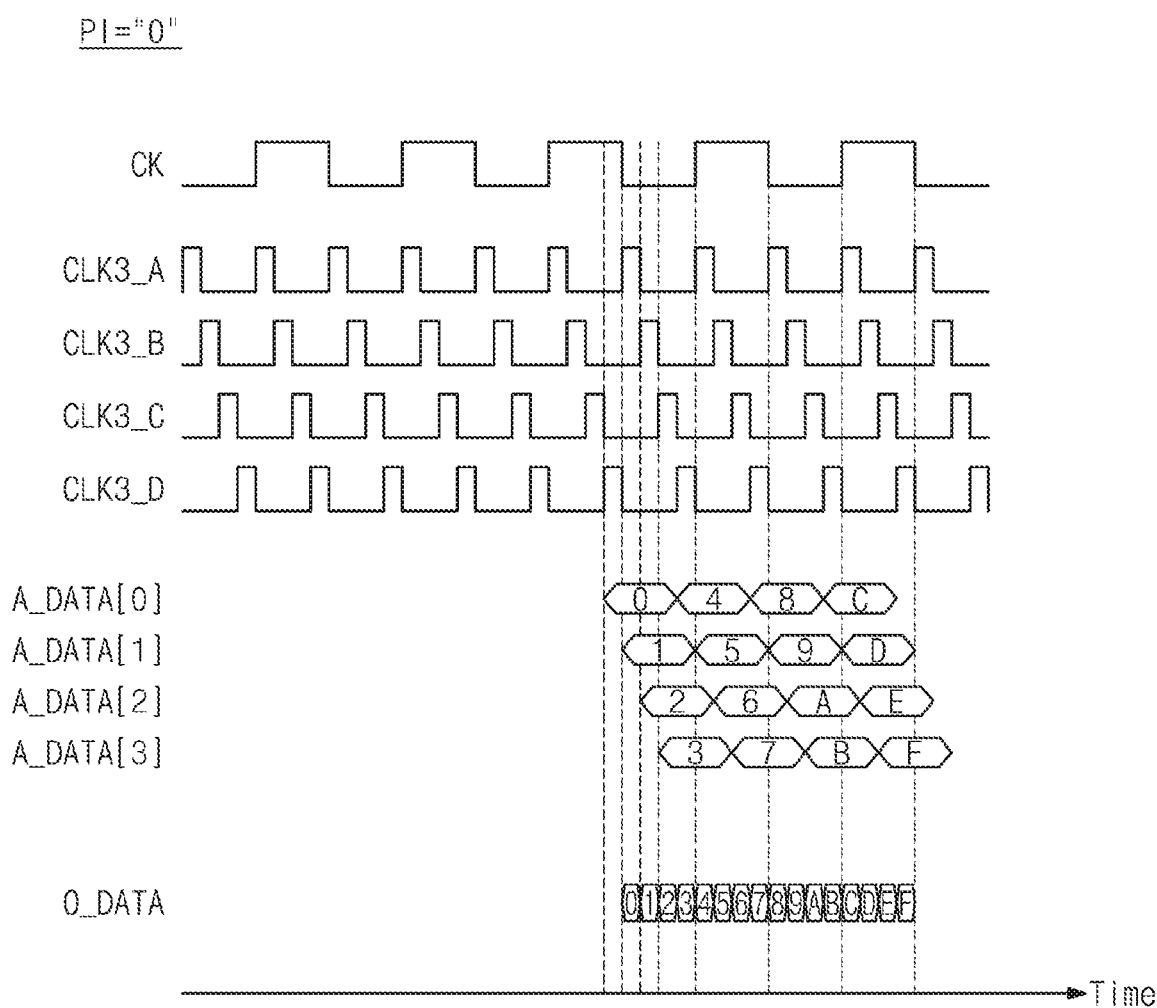
FIGS. 10A and 10B illustrate timing diagrams of a data output of an aligned data output unit of FIG. 8 according to an exemplary embodiment of the inventive concept.
Figure 10B:
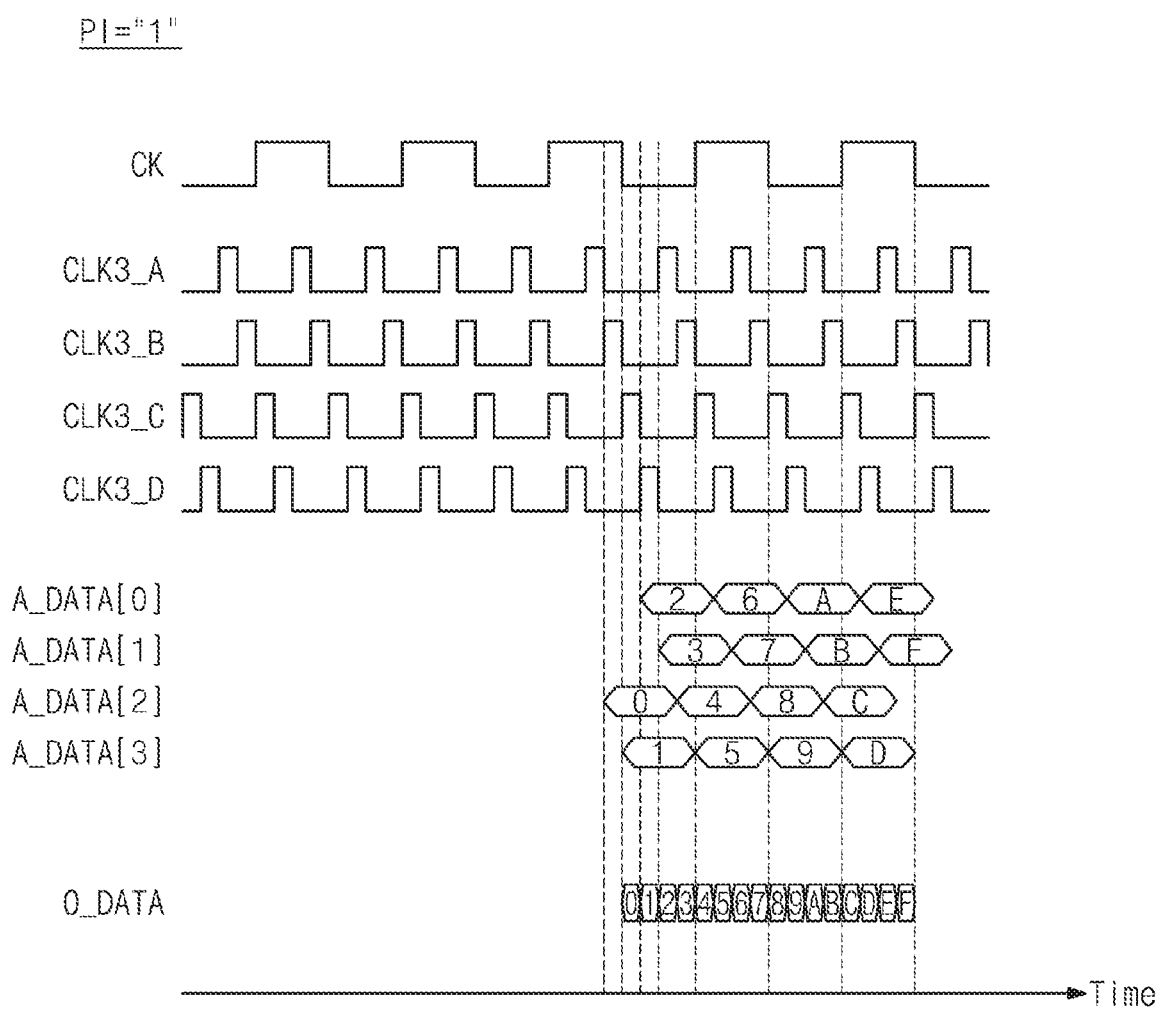

FIGS. 10A and 10B illustrate timing diagrams of a data output of an aligned data output unit of FIG. 8 according to an exemplary embodiment of the inventive concept. In detail, FIG. 10A indicates a data output of FIG. 10 when the phase information PI is "0", and FIG. 10B indicates a data output of FIG. 10 when the phase information PI is "1".

As illustrated in FIGS. 10A and 10B, phase differences of the third clocks CLK3_A to CLK3_D provided to the aligned data output unit 122 may be about 90 degrees. For example, a phase difference of the third clocks CLK3_A and CLK3_B may be about 90 degrees, a phase difference of the third clocks CLK3_B and CLK3_C may be about 90 degrees, and a phase difference of the third clocks CLK3_C and CLK3_D may be about 90 degrees.

The third clocks CLK3_A to CLK3_D may be generated by using the second clocks CLK2_A to CLK2_D illustrated in FIGS. 4A and 4B. A frequency of the third clocks CLK3_A to CLK3_D may be substantially the same as a frequency of the second clocks CLK2_A to CLK2_D, and a phase of the third clocks CLK3_A to CLK3_D may be substantially the same as a phase of the second clocks CLK2_A to CLK2_D. For example, the third clocks CLK3_A to CLK3_D may be generated by performing an AND operation on two clocks of the plurality of second clocks CLK2.

Referring to FIGS. 8 and 10A, since the phase information PI is "0", the aligned data output unit 122 may receive the 0-th aligned data A_DATA[0] to the third aligned data A_DATA[3] illustrated in FIG. 9A from the data align unit 121.

The aligned data output unit 122 may output the 0-th aligned data A_DATA[0] as the output data O_DATA, based on the third clock CLK3_A and may output the first aligned data A_DATA[1] as the output data O_DATA, based on the third clock CLK3_B. The aligned data output unit 122 may output the second aligned data A_DATA[2] as the output data O_DATA, based on the third clock CLK3_C and may output the third aligned data A_DATA[3] as the output data O_DATA, based on the third clock CLK3_D. For example, the aligned data output unit 122 may detect rising edges of the third clocks CLK3_A to CLK3_D to output the 0-th to third aligned data A_DATA[0] to A_DATA[3] as the output data O_DATA. In other words, the output data O_DATA may be output in the form of serial data sequentially aligned.

Referring to FIGS. 8 and 10B, since the phase information PI is "1", the aligned data output unit 122 may receive the 0-th aligned data A_DATA[0] to the third aligned data A_DATA[3] illustrated in FIG. 9B from the data align unit 121.

The aligned data output unit 122 may output the 0-th to third aligned data A_DATA[0] to A_DATA[3] as the output data O_DATA, based on the third clocks CLK3_A to CLK3_D. For example, the aligned data output unit 122 may detect rising edges of the third clocks CLK3_A to CLK3_D to output the 0-th to third aligned data A_DATA[0] to A_DATA[3] as the output data O_DATA. In other words, the output data O_DATA may be output in the form of serial data sequentially aligned.

As illustrated in FIGS. 10A and 10B, the output data O_DATA when the phase information PI is "0" may be the same as the output data O_DATA when the phase information PI is "1". Accordingly, according to an exemplary embodiment of the inventive concept, the data output circuit 100 may generate the same output data O_DATA regardless of a phase of provided clocks.

Since the data output circuit 100 according to an exemplary embodiment of the inventive concept swaps internally processed data depending on the phase information PI of provided clocks to allow a phase of data to be matched with a phase of clocks, the data output circuit 100 may output the same serial data regardless of a phase of clocks. This may mean that the data output circuit 100 does not include a separate circuit for adjusting phases of clocks. In other words, the data output circuit 100 may serialize data with low power and at high speed, and may output the serialized data.

Figure 11:
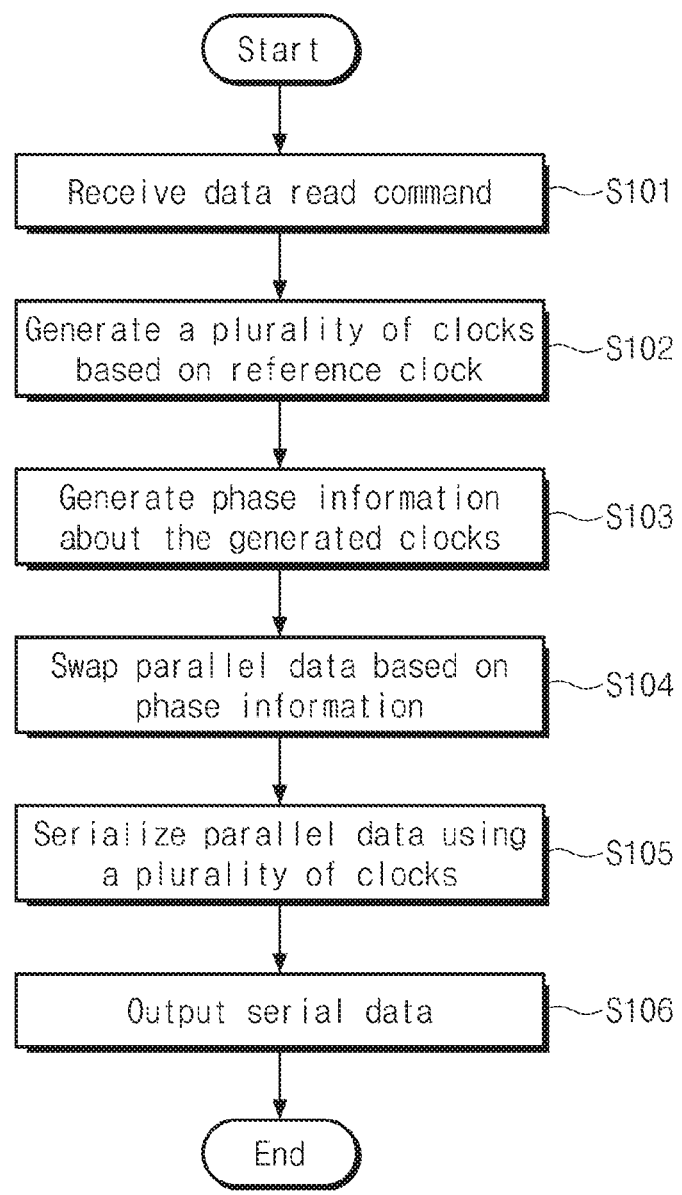
FIG. 11 illustrates a flowchart of an operation of the memory device of FIG. 1 according to an exemplary embodiment of the inventive concept.

FIG. 11 illustrates a flowchart of an operation of the memory device of FIG. 1 according to an exemplary embodiment of the inventive concept. Referring to FIGS. 1, 2, and 11, in operation S101, the memory device 10 may receive a data read command. In operation S102, the memory device 10 may generate the plurality of clocks CLK, based on the reference clock CK. In an exemplary embodiment of the inventive concept, the plurality of clocks CLK may include the first clock CLK1 and the second clock CLK2. A frequency of the second clock CLK2 may be two times higher than a frequency of the first clock CLK1.

In operation S103, the memory device 10 may generate the phase information PI about the generated clocks CLK. In an exemplary embodiment of the inventive concept, the memory device 10 may compare a phase of the reference clock CK and a phase of the generated clocks CLK and may generate the phase information PI as the comparison result.

In operation S104, the memory device 10 may swap parallel data, based on the phase information PI. The parallel data may be data transmitted from the input/output gate 18 to the data output circuit 100 through a plurality of data lines.

In operation S105, the memory device 10 may serialize the parallel data, based on the plurality of clocks CLK. In operation S106, the memory device 10 may output the serialized serial data.

Figure 12:
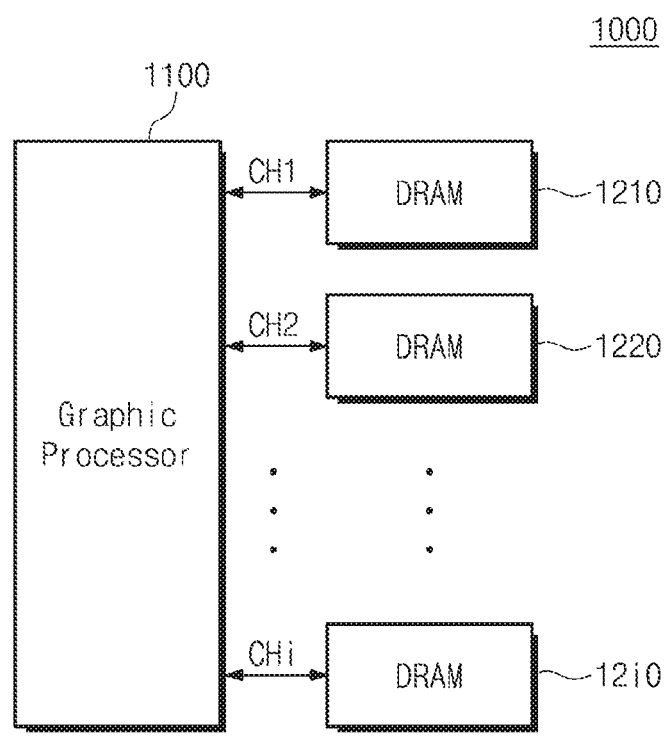
FIG. 12 illustrates a block diagram of a graphic system including a memory device according to an exemplary embodiment of the inventive concept.

FIG. 12 illustrates a block diagram of a graphic system including a memory device according to an exemplary embodiment of the inventive concept. Referring to FIG. 12, a graphic system 1000 may include a graphic processor 1100 and a plurality of DRAM devices 1210 to 12i0. The graphic processor 1100 may be configured to perform various operations for processing image information. The graphic processor 1100 may be connected with the plurality of DRAM devices 1210 to 12i0 through a plurality of channels CH1 to CHi. In an exemplary embodiment of the inventive concept, each of the plurality of channels CH1 to CHi may be a communication channel that is based on a graphic double data rate (GDDR) interface.

Each of the plurality of DRAM devices 1210 to 12i0 may include the data output circuit described with reference to FIGS. 1 to 11. In other words, each of the plurality of DRAM devices 1210 to 12i0 may generate output data as described with reference to FIGS. 1 to 11, and may provide the output data to the graphic processor 1100.

As described above, according to exemplary embodiments of the inventive concept, a data output circuit may output data, based on phase information about provided clocks. Additionally, the data output circuit may not include a separate circuit for adjusting phases of clocks. Accordingly, a data output circuit capable of outputting data with low power, a memory device including the data output circuit, and an operating method of the memory device may be provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
   a memory cell array configured to store input data;
   a clock generator circuit configured to generate first clocks and second clocks, using a reference clock;
   a phase information generator circuit configured to compare a phase of the reference clock and a phase of at least one of the first clocks and the second clocks, and to generate phase information as the comparison result;
   an intermediate data generator circuit configured to serialize a part of the input data provided from the memory cell array using the first clocks to generate a plurality of first data, to serialize a remaining part of the input data to generate a plurality of second data, and to selectively swap the plurality of first data and the plurality of second data using the phase information to generate a plurality of intermediate data; and
   an output data generator circuit configured to serialize the plurality of intermediate data using the second clocks, to output output data through one output data line.

2. The memory device of claim 1, wherein a frequency of the first clocks is substantially the same as a frequency of the reference clock, and a frequency of the second clocks is approximately two times the frequency of the reference clock.

3. The memory device of claim 1, wherein the intermediate data generator circuit includes:
   a clock selector circuit configured to select one of the first clocks, using the phase information; and
   a first serialization circuit configured to generate the plurality of first data and the plurality of second data, using the selected first clock.

4. The memory device of claim 1, wherein the intermediate data generator circuit includes:
   a delay circuit configured to delay the plurality of second data for a predetermined time and output a plurality of delayed second data.

5. The memory device of claim 4, wherein the intermediate data generator circuit further includes:
   a data swap circuit configured to selectively swap the plurality of first data and the plurality of delayed second data using the phase information to generate a plurality of third data.

6. The memory device of claim 5, wherein the intermediate data generator circuit further includes:
   a second serialization circuit configured to serialize the plurality of third data using the first clocks, to generate the plurality of intermediate data.

7. The memory device of claim 6, wherein the first clocks includes a clock having a first phase and a clock having a second phase, and
   wherein the second serialization circuit serializes a part of the plurality of third data using the clock having the first phase, and serializes a remaining part of the plurality of third data using the clock having the second phase.

8. The memory device of claim 1, wherein the output data generator circuit includes:
   a data align circuit configured to align the plurality of intermediate data using the second clocks, such that the plurality of intermediate data are output at regular time intervals as aligned data.

9. The memory device of claim 8, wherein the output data generator circuit further includes:
   an aligned data output circuit configured to serialize the aligned data to output the output data.

10. The memory device of claim 9, wherein the aligned data output circuit operates using third clocks generated from the second clocks.

11. An operating method of a memory device comprising a memory cell array storing input data, the method comprising:
    generating first clocks and second clocks, using a reference clock;
    generating phase information associated with the first clocks and the second clocks;
    serializing a part of the input data provided from the memory cell array to generate a plurality of first data and serializing a remaining part of the input data to generate a plurality of second data, using the first clocks;
    selectively swapping the plurality of first data and the plurality of second data using the phase information to generate a plurality of intermediate data; and
    serializing the plurality of intermediate data using the second clocks to output output data through one output data line.

12. The operating method of claim 11, wherein the phase information is generated as a result of comparing a phase of the reference clock and a phase of at least one of the first clocks and the second clocks.

13. The operating method of claim 11, further comprising:
delaying the plurality of second data for a predetermined time,
wherein the plurality of intermediate data are generated by selectively swapping the plurality of first data and the plurality of delayed second data.

14. The operating method of claim 13, wherein the generating of the plurality of intermediate data includes:
selectively swapping the plurality of first data and the plurality of delayed second data to generate a plurality of third data; and
serializing the plurality of third data using the first clocks to generate the plurality of intermediate data.

15. The operating method of claim 11, wherein the outputting of the output data includes:
aligning the plurality of intermediate data using the second clocks such that the plurality of intermediate data are output at regular time intervals as aligned data; and
serializing the aligned data to output the output data.

16. A data output circuit comprising:
a first serialization circuit configured to operate based on first clocks, wherein the first serialization circuit serializes a part of input data to generate a plurality of first data and serializes a remaining part of the input data to generate a plurality of second data;
a data swap circuit configured to selectively swap the plurality of first data and the plurality of second data using phase information of the first clocks, to generate a plurality of third data;
a second serialization circuit configured to serialize the plurality of third data using the first clocks, to generate a plurality of intermediate data; and
an output data generator circuit configured to serialize the plurality of intermediate data using second clocks, to output output data through one output data line.

17. The data output circuit of claim 16, wherein the phase information is generated as a result of comparing a phase of a reference clock and a phase of at least one of the first clocks and the second clocks.

18. The data output circuit of claim 17, wherein the first clocks includes two clocks, and a phase of one of the two clocks is substantially the same as the phase of the reference clock.

19. The data output circuit of claim 16, further comprising:
a clock selector circuit configured to select one of the first clocks, using the phase information,
wherein the first serialization circuit operates using the selected first clock.

20. The data output circuit of claim 16, further comprising:
a delay circuit configured to delay the plurality of second data for a predetermined time, using the first clocks, and output a plurality of delayed second data,
wherein the data swap circuit selectively swaps the plurality of first data and the plurality of delayed second data.

* * * * *